(12) United States Patent
Ohe et al.

(10) Patent No.: US 8,115,197 B2
(45) Date of Patent: Feb. 14, 2012

(54) ORGANIC SEMICONDUCTOR MATERIAL, ORGANIC SEMICONDUCTOR THIN FILM AND ORGANIC SEMICONDUCTOR DEVICE

(75) Inventors: Takahiro Ohe, Tokyo (JP); Noriyuki Kawashima, Tokyo (JP); Tamotsu Takahashi, Hokkaido (JP); Ken-Ichiro Kanno, Hokkaido (JP)

(73) Assignees: Sony Corporation, Tokyo (JP); National University Corporation Hokkaido University, Tokyo (JP)

( * ) Notice: Subject to any disclaimer, the term of this patent is extended or adjusted under 35 U.S.C. 154(b) by 947 days.

(21) Appl. No.: 11/421,295

(22) Filed: May 31, 2006

(65) Prior Publication Data

US 2006/0273311 A1    Dec. 7, 2006

(30) Foreign Application Priority Data

Jun. 1, 2005  (JP) ................................ P2005-161301
Feb. 28, 2006  (JP) ................................ P2006-052927

(51) Int. Cl.
*H01L 51/00*   (2006.01)
(52) U.S. Cl. .................. 257/40; 257/368; 257/E51.027; 438/99; 560/80
(58) Field of Classification Search .............. 257/40, 257/368, E51.027; 438/99; 560/80
See application file for complete search history.

(56) References Cited

U.S. PATENT DOCUMENTS 6,344,284 B1 * 2/2002 Chou ............................ 428/690
(Continued)

FOREIGN PATENT DOCUMENTS

JP    2004256532    9/2004

OTHER PUBLICATIONS

Payne et al., "Stable, Crystalline Acenedithiophenes With Up to Seven Linearly Fused Rings," Organic Letters, vol. 6, No. 19, pp. 3325-3328 (2004).

(Continued)

*Primary Examiner* — Matthew Landau
*Assistant Examiner* — Colleen E Snow
(74) *Attorney, Agent, or Firm* — K&L Gates LLP

(57) ABSTRACT

An organic semiconductor material is provided. The organic semiconductor material includes a polyacene derivative expressed by the following general formula (1):

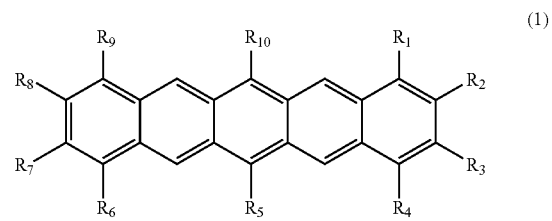

where each of $R_1$ to $R_{10}$ may be independently the same substituents or different substituents but all of $R_1$, $R_4$, $R_5$, $R_6$, $R_9$ and $R_{10}$ may never be hydrogen atoms at the same time, and where each of $R_1$ to $R_{10}$ is at least one kind of substituent selected from the group consisting of an aliphatic hydrocarbon group having a substituent and of which number of carbon atoms ranges of from 1 to 20, an aromatic hydrocarbon group having a substituent, a complex aromatic group having a substituent, a carboxyl group, a hydride, an ester group, a cyano group, a hydroxyl group, a halogen atom and a hydrogen atom. The organic semiconductor material can be dissolved into an organic solvent at low temperature (for example, room temperature) and is suitable for use with a coating process.

14 Claims, 5 Drawing Sheets

U.S. PATENT DOCUMENTS

| | | | | |
|---|---|---|---|---|
| 6,489,046 | B1 * | 12/2002 | Ikeda et al. | 428/690 |
| 7,061,010 | B2 * | 6/2006 | Minakata | 257/40 |
| 2003/0116755 | A1 * | 6/2003 | Takahashi | 252/500 |
| 2008/0042129 | A1 * | 2/2008 | Nakagawa et al. | 257/40 |
| 2008/0061287 | A1 * | 3/2008 | Nagata et al. | 257/40 |
| 2008/0128680 | A1 * | 6/2008 | Anthony et al. | 257/40 |
| 2008/0207864 | A1 * | 8/2008 | Nakagawa et al. | 528/25 |

OTHER PUBLICATIONS

Anthony et al., "A Road Map to Stable, Soluble, Easily Crystallized Pentacene Derivatives," Organic Letters, vol. 4, No. 1, pp. 15-18 (2002).

Maulding et al., "Electronic Absorption and Fluorescence of Phenylethynyl-Substituted Acenes," The Journal of Organic Chemistry, vol. 34, No. 6, pp. 1734-1736 (1969).

Takahashi et al., "Straighforward Method for Synthesis of Highly Alkyl-Substituted Naphthacene and Pentacene Derivatives by Homologation," J. Am. Chem. Soc., vol. 122, pp. 12876-12877 (2000).

Sheraw et al., "Organic Thin-Film Transistor-Driven Polymer-Dispersed Liquid Crystal Displays on Flexible Polymeric Substrates," Applied Physics Letters, vol. 80, No. 6, pp. 1088-1090 (2002).

Bao et al., "Soluble and Processable Regioregular Poly(3-Hexylthiophene) for Thin Film Field-Effect Transistor Application With High Mobility," Applied Physics Letters, vol. 69, No. 26, pp. 4108-4110 (1996).

Meng et al., "Tetramethylpentacene: Remarkable Absence of Steric Effect on Field Effect Mobility," Advanced Materials, vol. 15, No. 13, pp. 1090-1093 (2003).

Afzali et al., "High-Performance, Solution-Processed Organic Thin Film Transistors From a Novel Pentacene Precursor," J. Am. Chem. Soc., vol. 124, pp. 8812-8813 (2002).

Wenying Huang, Xin Zhou, Ken-Ichiro Kanno, Tamotsu Takahashi: "Pd-Catalized Reactions of o-Diiodoarenes with Alkynes for Aromatic Ring Extension" Organic Letters, vol. 6, No. 14, Jun. 17, 2004 pp. 2429-2431.

European Search Report for corresponding EP 06011265 dated Jan. 7, 2010.

* cited by examiner

Ethyl Group

Propyl Group

Butyl Group

ORGANIC SEMICONDUCTOR MATERIAL, ORGANIC SEMICONDUCTOR THIN FILM AND ORGANIC SEMICONDUCTOR DEVICE

CROSS REFERENCES TO RELATED APPLICATIONS

The present application claims priority to Japanese Patent Application JP 2005-161301 filed in the Japanese Patent Office on Jun. 1, 2005 and Japanese Patent Application JP 2006-052927 filed in the Japanese Patent Office on Feb. 28, 2006 the entire contents of which being incorporated herein by reference.

BACKGROUND

The present application relates to organic semiconductor materials, organic semiconductor thin films and organic semiconductor devices.

Semiconductor devices using organic semiconductor materials are able to decrease a manufacturing cost as compared with related-art semiconductor devices using inorganic semiconductor materials such as Si (silicon) and they can be also expected as semiconductor devices with flexibility as well. Then, various kinds of organic semiconductor materials such as polythiophene and rubrene are now under studies as the organic semiconductor materials, and it has been reported that a transistor including a channel forming region made of these organic semiconductor materials may have mobility of substantially the same as that of a transistor including a channel forming region made of amorphous silicon (see APL Vol. 80, No. 6, 1088-1090 (2002), for example).

When the channel forming region is made by these organic semiconductor materials, since these organic semiconductor materials are difficult to be dissolved into an organic solvent and the application of a coating process to these organic semiconductor materials is difficult and it is customary that semiconductor films are exclusively formed by a vacuum evaporation coating method. On the other hand, a simple alkyl chain and other substituents are introduced into these organic semiconductor materials to cause an organic solvent to have affinity so that these organic semiconductor materials can be dissolved into the organic solvent. In actual practice, poly-3-hexylthiophene (P3HT) can be dissolved into an organic solvent such as chloroform and toluene and it has been reported that a channel forming region could be formed by a coating process such as a spin coating method (see APL 69 (26), 4108-4110 (1996) for example).

On the other hand, a polyacene compound, which is a condensed polycyclic compound, is a molecule having a π electron conjugated system similarly to polyacetylene and polyphenylene. In addition, the polyacene compound has a small bandgap as compared with polyacetylene and the like from theoretically and it is a compound which can be expected to have excellent functions as an organic semiconductor material. Substituents that have been introduced into the polyacene compound can be used so that it can be coupled to their molecules and a functional group on the surface of an insulating film. Also, these substituents can be used to control a distance, a position and an arrangement of an acene bone and patterning and the like. The polyacene compound is a compound in which benzene rings are coupled in a straight line fashion. A polyacene compound without substituents has properties in which it becomes difficult to be dissolved into an organic solvent in accordance with the increase of the number of the benzene rings. In particular, a polyacene compound greater than pentacene having five benzene rings coupled loses its solubility to almost all of organic solvents and it is very difficult to form a uniform film based on a suitable method such as the spin coating method. Even if a uniform film can be formed by using such polyacene compound based on the spin coating method and the like, it is unavoidable that organic solvents and temperature conditions available in the spin coating method and the like will be extremely limited (for example, trichlorobenzene and 60 to 180° C.). Also, it is widely known that stability of the polyacene compound is lowered as the number of benzene rings is increased and that pentacene is oxidized by oxygen in the air. That is, pentacene is poor in oxidation resistance.

2,3,9,10-tetramethylpentacene was reported as an example in which substituents are introduced into a polyacene compound (see Wudl and Bao, Adv. Mater Vol. 15, No. 3 (1090-1093), 2003). However, this 2,3,9,10-tetramethylpentacene can be slightly dissolved into warmed 1,2-dichlorobenzene, and hence a channel forming region constructing an FET (field-effect transistor) is formed by a vacuum evaporation coating method.

Also, Japanese Published Patent Application No. 2004-256532 has described that 2,3,9,10-tetramethylpentacene and 2,3-dimethylpentacene are dissolved into 1,2-dichlorobenzene. However, they can be dissolved into 1,2-dichlorobenzene at 120° C. but the fact that they are dissolved into 1,2-dichlorobenzene at room temperature is not described in the above Japanese Published Patent Application 2004-256532.

J. Am. Chem. Soc. 124, 8812-8813 (2002) has reported a technology in which a substituent, which is capable of carrying out thermal reversible reaction, is introduced into pentacene to prepare a solution in the pentacene precursor state with high solubility relative to an organic solvent, this solution is coated on the substrate and heated, thereby resulting in a pentacene thin film being formed on the substrate.

Also, compounds in which substituents are introduced into pentacene are known from a long ago and D. R. Maulding et al. has reported syntheses of several pentacene derivatives in Journal of Organic Chemistry, Vol. 34, No. 6, 1734-1736 (1969). Also, in recent years, Takahashi et al. and Anthony et al. have reported many pentacene derivatives. For example, refer to Organic Letters Vol. 6, No. 19, 3325-3328 (2004) and Organic Letters Vol. 4, No. 1, 15-18 (2002).

As described above, although the polyacene compound is a compound which can be expected to exhibit excellent functions as an organic semiconductor material, the polyacene compound is difficult to be dissolved at low temperature (for example, room temperature) and which is therefore not suitable for use with a coating process such as a spin coating method.

SUMMARY

In view of the aforesaid aspects, the present application intends to provide an organic semiconductor material which can be dissolved into an organic solvent at low temperature (for example, room temperature) and which is made of a polyacene derivative suitable for use with a coating process.

Further, the present application intends to provide an organic semiconductor thin film and an organic semiconductor device based on the above organic semiconductor material.

According to a first embodiment, there is provided an organic semiconductor material consisting of a polyacene derivative expressed by the following general formula (1), each of $R_1$, $R_2$, $R_3$, $R_4$, $R_5$, $R_6$, $R_7$, $R_8$, $R_9$ and $R_{10}$ in the general formula (1) satisfying the following (condition-A1) and (condition-A2):

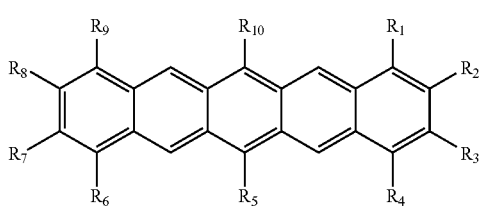

(1)

(Condition-A1)

$R_1$, $R_2$, $R_3$, $R_4$, $R_5$, $R_6$, $R_7$, $R_8$, $R_9$ and $R_{10}$ may be independently the same substituents or different substituents but all of $R_1$, $R_4$, $R_5$, $R_6$ and $R_{10}$ may never be hydrogen atoms at the same time. (Condition-A2) each of $R_1$, $R_2$, $R_3$, $R_4$, $R_5$, $R_6$, $R_7$, $R_8$, $R_9$ and $R_{10}$ is at least one kind of substituent selected from a substituent family consisting of an aliphatic hydrocarbon group which has substituents or no substituents and of which number of carbon atoms ranges from 1 to 20, an aromatic hydrocarbon group, which has substituents or no substituents, a complex aromatic group which has substituents or no substituents, a carboxyl group, a hydride, an ester group, a cyano group, a hydroxyl group, a thiocarboxyl group, a dithiocarboxyl group, a sulfonic acid group, a sulfinic acid group, a sulfenic acid group, a sulfonyl group, a sulfinyl group, an acyl halide group, a carbamoyl group, a hydrazide group, an imide group, an amide group, an amidino group, an isocyano group, a cyanic acid ester group, an isocyanic acid ester group, a thiocyanic acid ester group, an isothiocyanic acid ester group, a formyl group, a thioformyl group, an acyl group, a thiol group, an amino group, an imino group, a hydrazino group, an alkoxy group, an arlyoxy group, an ether group, a sulfide group, a disulfide group, a silyl group, a germyl group, a stannyl group, a phosphino group, a boryl group, a halogen atom and a hydrogen atom.

In the organic semiconductor material according to the first embodiment, it is preferable that each of $R_1$, $R_2$, $R_3$, $R_4$, $R_5$, $R_6$, $R_7$, $R_8$, $R_9$ and $R_{10}$ should be at least one kind of substituent selected from a substituent family consisting of an aliphatic hydrocarbon group having a substituent and of which number of carbon atoms ranges from 1 to 20, an aromatic hydrocarbon group having a substituent, a complex aromatic group, a carboxyl group, a hydride, an ester group, a cyano group, a hydroxyl group, a halogen atom and a hydrogen atom. For convenience sake of explanation, the above-mentioned aspect will hereinafter be referred to as an "organic semiconductor material according to the aspect 1A".

According to a second embodiment, there is provided an organic semiconductor material consisting of a polyacene derivative expressed by the following general formula (2) [where n is an integer ranging of from 0 to 20], each of $R_1$, $R_2$, $R_3$, $R_4$, $R_5$, $R_6$, $R_7$ and $R_8$ satisfying the following (condition-B1) and (condition-B2).

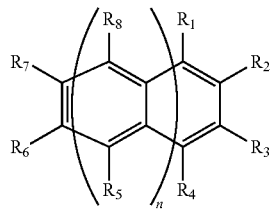

(2)

(Condition-B1)

$R_1$, $R_2$, $R_3$, $R_4$, $R_5$, $R_6$, $R_7$ and $R_8$ may be independently the same substituents or different substituents, when n is greater than 2, a plurality of $R_5$ existing the general formula (2) may be the same substituents or different substituents, a plurality of R8 existing in the general formula (2) may be the same substituents or different substituents and $R_1$, $R_4$, $R_5$ and $R_8$ may never be hydrogen atoms at the same time.

(Condition-B2)

Each of $R_1$, $R_2$, $R_3$, $R_4$, $R_5$, $R_6$, $R_7$ and $R_8$ in the (condition-B1) is at least one kind of substituent selected from a substituent family consisting of an aliphatic hydrocarbon group which has substituents or no substituents and of which number of carbon atoms ranges from 1 to 20, an aromatic hydrocarbon group which has substituents or no substituents, a complex aromatic group which has substituents or no substituents, a carboxyl group, a hydride, an ester group, a cyano group, a hydroxyl group, a thiocarboxyl group, a dithiocarboxyl group, a sulfonic acid group, a sulfinic acid group, a sulfenic acid group, a sulfonyl group, a sulfinyl group, an acyl halide group, a carbamoyl group, a hydrazide group, an imide group, an amide group, an amidino group, an isocyano group, a cyanic acid ester group, an isocyanic acid ester group, a thiocyanic acid ester group, an isothiocyanic acid ester group, a formyl group, a thioformyl group, an acyl group, a thiol group, an amino group, an imino group, a hydrazino group, an alkoxy group, an arlyoxy group, an ether group, a sulfide group, a disulfide group, a silyl group, a germyl group, a stannyl group, a phosphino group, a boryl group, a halogen atom and a hydrogen atom.

In the organic semiconductor material according to the second embodiment, it is preferable that each of $R_1$, $R_2$, $R_3$, $R_4$, $R_5$, $R_6$, $R_7$ and $R_8$ should be at least one kind of a substituent selected from a substituent family consisting of an aliphatic hydrocarbon group which has substituents or no substituents and of which number of carbon atoms ranges from 1 to 20, an aromatic hydrocarbon group which has substituents or no substituents, a complex aromatic group which has substituents or no substituents, a carboxyl group, a hydride, an ester group, a cyano group, a hydroxyl group, a halogen atom and a hydrogen atom. For convenience sake of explanation, the above-mentioned aspect will hereinafter be referred to as an "organic semiconductor material according to the aspect 2A".

In the organic semiconductor materials according to the first embodiment, the aspect 1A, the second embodiment or the aspect 2A, when a substituent is an aliphatic hydrocarbon group, an alkyl group, an alkenyl group and an alkynyl group can be enumerated as substituents specifically.

Also, in the (condition-A2) in the organic semiconductor materials according to the first aspect and the aspect 1A of the present invention and in the (condition-B2) in the organic semiconductor materials according to the second aspect and the aspect 2A of the present invention, $R_1$ to $R_{10}$ or $R_1$ to $R_8$ are at least one kind of substituent selected from the substituent family and this substituent may include a substituent containing more than one kind of substituents properly selected from the substituent family.

In the organic semiconductor material according to the first embodiment, $R_m$ and $R_{m'}$ (m and m' are integers ranging of from 1 to 10 and m≠m') may be cross-linked with each other to form a saturated ring or an unsaturated ring (structure including a double bond or a tripe bond) of which number of carbon atoms lies in a range of from 4 to 20. An example in which a saturated ring of which number of carbon atoms is 4 is formed by crosslinking, an example in which a saturated ring of which number of carbon atoms is 5 is formed by cross-linking, an example in which an unsaturated ring of which number of carbon atoms is 4 is formed by crosslinking and an example in which an unsaturated ring of which number of carbon atoms is 5 is formed by crosslinking are shown as follows.

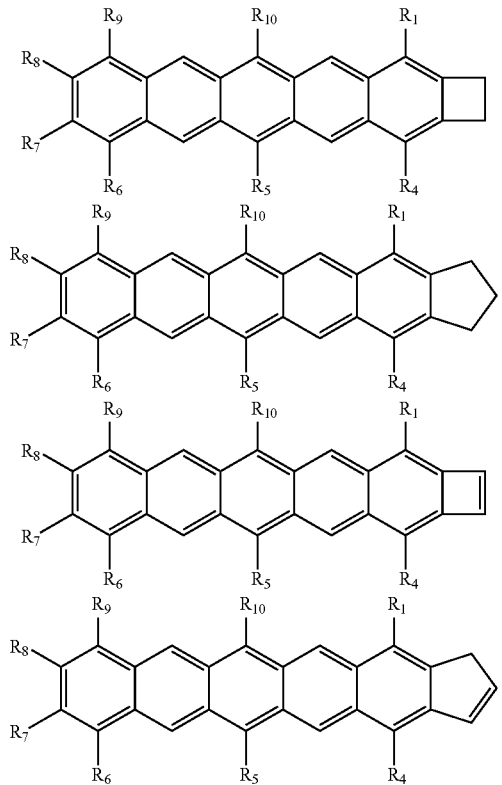

Also, in the organic semiconductor material according to the aspect 1A, when $R_1$ to $R_{10}$ are the aliphatic hydrocarbon groups, a carboxyl group, a hydride, an ester group, a cyano group, a hydroxyl group and a halogen atom may be bonded to a terminal of or somewhere of this aliphatic hydrocarbon group in the branched state. $R_2$ and $R_3$ may be crosslinked to form a saturated ring or unsaturated ring of which number of carbon atoms lies in a range of from 4 to 20. $R_7$ and $R_8$ may be crosslinked to form a saturated ring or unsaturated ring of which number of carbon atoms lies in a range of from 4 to 20.

In the organic semiconductor material according to the second embodiment, $R_m$ and $R_{m'}$ (m and m' are integers ranging of from 1 to 8 and m≠n') may be crosslinked to form a saturated ring or unsaturated ring (structure including a double bond and a triple bond) of which number of carbon atoms lies in a range of from 4 to 20. Further, when n is greater than 2, a plurality of $R_5$ existing in the general formula (2) may be crosslinked with each other. Also, a plurality of $R_8$ existing in the general formula (2) may be crosslinked with each other.

Also, in the organic semiconductor material according to the aspect 2A, when $R_1$ to $R_8$ are the aliphatic hydrocarbon groups, a carboxyl group, a hydride, an ester group, a cyano group, a hydroxyl group and a halogen atom may be bonded to a terminal of or somewhere of this aliphatic hydrocarbon group in the branched state. $R_2$ and $R_3$ may be crosslinked to form a saturated ring or unsaturated ring of which number of carbon atoms lies in a range of from 4 to 20. $R_6$ and $R_7$ may be crosslinked to form a saturated ring or an unsaturated ring of which number of carbon atoms lies in a range of from 4 to 20. Further, when n is greater than 2, a plurality of $R_5$ existing in the general formula (2) may be crosslinked with each other. Also, a plurality of $R_8$ existing in the general formula (2) may be crosslinked with each other.

The (condition-A2) in the organic semiconductor material according to the first embodiment is the condition identical to the (condition-B2) in the organic semiconductor material according to the second embodiment. In the (condition-A2) and the (condition-B2), each of $R_1$ to $R_{10}$ and $R_8$ is at least one kind of a substituent selected from a substituent family consisting of 45 kinds in total. Accordingly, theoretically, $45^{10}$ combinations exist at maximum as combinations of ($R_1$, $R_2$, $R_3$, $R_4$, $R_5$, $R_6$, $R_7$, $R_8$, $R_9$, $R_{10}$), and any combinations may be used so long as it can satisfy the (condition-A1). Also, in the organic semiconductor material according to the second embodiment, $45^{(6+2n)}$ combinations exist at maximum as the combinations of ($R_1$, $R_2$, $R_3$, $R_4$, $R_5$, $R_6$, $R_7$, $R_8$) theoretically, and any combination may be used so long as it can satisfy the (condition-B1).

Also, the substituent family in the organic semiconductor material according to the aspect 1A is identical to that in the organic semiconductor material according to the aspect 2A. Then, each of $R_1$ to $R_{10}$ and $R_1$ to $R_8$ is at least one kind of a substituent selected from a substituent family consisting of 10 kinds of substituents in total. Accordingly, in the organic semiconductor material according to the aspect 1A of the present invention, $10^{10}$ combinations exist at maximum as the combinations of ($R_1$, $R_2$, $R_3$, $R_4$, $R_5$, $R_6$, $R_7$, $R_8$, $R_9$, $R_{10}$) theoretically, and any combination may be used so long as it can satisfy the (condition-A1). Also, in the organic semiconductor material according to the aspect 2A of the present invention, $10^{(6+2n)}$ combinations exist at maximum as the combinations of ($R_1$, $R_2$, $R_3$, $R_4$, $R_5$, $R_6$, $R_7$, $R_8$) theoretically, and any combination may be used so long as it can satisfy the (condition-B1).

In the organic semiconductor material according to the first embodiment or the aspect 1A, it is preferable that a substituent at a part of an acence bone should be an alkyl group of which number of carbon atoms is greater than 3 from a standpoint of improving its solubility relative to an organic solvent more. Also, in the organic semiconductor material according to the second embodiment or the aspect 2A, it is preferable that n should be greater than 3 and that a substituent at a part of an acene bone should be an alkyl group of which number of carbon atom is greater than 3 from a standpoint of improving its solubility relative to an organic solvent more. The substituent at a part of the acene bond may be, specifically, any one of substituents within $R_1$ to $R_{10}$ (the first aspect or the aspect 1A of the present invention) or $R_1$ to $R_8$ (the second aspect or the aspect 2A of the present invention). Alternatively, the cases in which all of R to $R_8$ (the second aspect or the aspect 2A of the present invention) are the alkyl group of which number of carbon atoms is greater than 3 may be included. In the research in which anthracene having a certain degree of solubility relative to an organic solvent and an anthracene derivative are compared with each other, the fact that any one of the anthracene and the anthracene derivative having a long alkyl chain is advantageous from a solubility standpoint is suggested in a doctor's thesis "Synthesis and Application of Condensed Polycyclic Compounds having Functionality" (2003), written by Masanori Kitamura, Hokkaido University. Having made further examinations by using a pentacene and a pentacene derivative which is difficult to be solved into an organic solvent, the inventors of the present application understood that lengths rather than the ratios of the substituents ($R_1$ to $R_{10}$ and $R_1$ to $R_8$) in the acene bone considerably affect solubility relative to the organic solvent. In particular, improvement of solubility in the polyacene derivative into which the alkyl group was introduced as the substituent is more remarkable in an alkyl group of which number of carbon atoms is greater than 3 (alkyl group having a length longer than that of a propyl group). It was clarified that, although an ethyl group used as a substituent are able to achieve sufficient effects relative to improvements of solubility, the kind of the organic solvent and the temperature at which it can be dissolved into the organic solvent are limited to ranges narrower than that of the alkyl group having a length longer than that of a propyl group.

An organic semiconductor material according to the third embodiment consisting of a polyacene derivative expressed by the following general formula (3), each of $R_1$, $R_2$, $R_3$, $R_4$, $R_5$ and $R_6$ in the general formula (3) satisfying the following (condition-C1) and (condition-C):

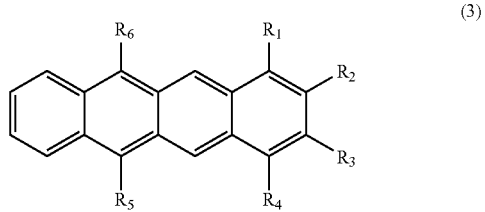

(3)

(Condition-C1)

$R_1$, $R_2$, $R_3$, $R_4$, $R_5$ and $R_6$ may be independently the same substituents or different substituents but all of $R_1$, $R_4$, $R_5$ and $R_6$ may never be hydrogen atoms at the same time.

(Condition-C2)

Each of $R_1$, $R_2$, $R_3$, $R_4$, $R_5$ and $R_6$ is at least one kind of substituent selected from a substituent family consisting of an aliphatic hydrocarbon group which has substituents or no substituents and of which number of carbon atoms ranges from 1 to 20, an aromatic hydrocarbon group which has substituents or no substituents, a complex aromatic group which has substituents or no substituents, a carboxyl group, a hydride, an ester group, a cyano group, a hydroxyl group, a thiocarboxyl group, a dithiocarboxyl group, a sulfonic acid group, a sulfinic acid group, a sulfenic acid group, a sulfonyl group, a sulfinyl group, an acyl halide group, a carbamoyl group, a hydrazide group, an imide group, an amide group, an amidino group, an isocyano group, a cyanic acid ester group, an isocyanic acid ester group, a thiocyanic acid ester group, an isothiocyanic acid ester group, a formyl group, a thioformyl group, an acyl group, a thiol group, an amino group, an imino group, a hydrazino group, an alkoxy group, an arlyoxy group, an ether group, a sulfide group, a disulfide group, a silyl group, a germyl group, a stannyl group, a phosphino group, a boryl group, a halogen atom and a hydrogen atom.

In the organic semiconductor material according to the third embodiment, it is preferable that each of $R_1$, $R_2$, $R_3$, $R_4$, $R_5$ and $R_6$ should be at least one kind of a substituent selected from a substituent family consisting of an aliphatic hydrocarbon group having a substituent and of which number of carbon atoms ranges from 1 to 20, an aromatic hydrocarbon group having a substituent, a complex aromatic group having a substituent, a carboxyl group, a hydride, an ester group, a cyano group, a hydroxyl group, a halogen atom and a hydrogen atom. For convenience sake of explanation, the above-mentioned aspect will hereinafter be referred to as an "organic semiconductor material according to the aspect 3A of the present invention".

In the organic semiconductor materials according to the third embodiment or the aspect 3A, when a substituent is an aliphatic hydrocarbon group, an alkyl group, an alkenyl group and an alkynyl group can be enumerated as s substituents specifically.

Also, in the (condition-C2) in the organic semiconductor materials according to the third embodiment or the aspect 3A, $R_1$ to $R_6$ are at least one kind of substituent selected from the substituent family and this substituent may include a substituent containing more than one kind of substituents properly selected from the substituent family.

In the organic semiconductor material according to the third embodiment, $R_m$ and $R_{m'}$ (m and m' are integers ranging of from 1 to 6 and m≠m') may be cross-linked with each other to form a saturated ring or an unsaturated ring (a structure including a double bond or a tripe bond) of which number of carbon atoms lies in a range of from 4 to 20. Also, in the organic semiconductor material according to the aspect 3A, when $R_1$ to $R_6$ are the aliphatic hydrocarbon group, a carboxyl group, a hydride, an ester group, a cyano group, a hydroxyl group and a halogen atom may be bonded to a terminal of or somewhere of this aliphatic hydrocarbon group in the branched state. $R_2$ and $R_3$ may be crosslinked to form a saturated ring or unsaturated ring of which number of carbon atoms lies in a range of from 4 to 20.

The (condition-C2) in the organic semiconductor material according to the third embodiment is the condition identical to the (condition-A2) in the organic semiconductor material according to the first aspect of the present invention. In the (condition-C2), each of $R_1$ to $R_6$ is at least one kind of a substituent selected from a substituent family consisting of 45 kinds in total. Accordingly, theoretically, 456 combinations exist at maximum as combinations of ($R_1$, $R_2$, $R_3$, $R_4$, $R_5$, $R_6$), and any combinations may be used so long as it can satisfy the (condition-C1). Also, the substituent family in the organic semiconductor material according to aspect 3A is identical to that in the organic semiconductor material according to aspect 1A. Then, each of $R_1$ to $R_6$ is at least one kind of a substituent selected from a substituent family consisting of 10 kinds of substituents in total. Accordingly, in the organic semiconductor material according to aspect 3A, $10^{10}$ combinations exist at maximum as the combinations of ($R_1$, $R_2$, $R_3$, $R_4$, $R_5$, $R_6$) theoretically, and any combination may be used so long as it can satisfy the (condition-C1).

In the organic semiconductor material according to the third embodiment or aspect 3A, it is preferable that a substituent at a part of an acence bone should be an alkyl group of which number of carbon atoms is greater than 3 from a standpoint of improving its solubility relative to an organic solvent more. The substituent at a part of the acene bond may be, specifically, any one of substituents within $R_1$ to $R_6$. Also, the cases in which all of $R_1$ to $R_6$ are the alkyl group of which number of carbon atoms is greater than 3 may be included.

The organic semiconductor thin film according to the first embodiment to attain the above-described objects is characterized in that it is composed of the organic semiconductor materials according to the first embodiment or aspect 1A including the above-mentioned various preferred embodiments and that it has crystallinity.

Also, the organic semiconductor device according to the first embodiment to attain the above-described objects is characterized in that it includes the organic semiconductor thin film composed of the organic semiconductor materials according to the first embodiment or aspect 1A including the above-mentioned various preferred embodiments and that the organic semiconductor thin film has crystallinity.

The organic semiconductor thin film according to the second embodiment to attain the above-described objects is characterized in that it is composed of the organic semiconductor materials according to the second aspect or the aspect 2A of the present invention including the above-mentioned various preferred embodiments and that it has crystallinity.

Also, the organic semiconductor device according to the second embodiment to attain the above-described objects is characterized in that it includes the organic semiconductor thin film composed of the organic semiconductor materials according to the second embodiment or aspect 2A including the above-mentioned various preferred embodiments and that the semiconductor thin film has crystallinity.

The organic semiconductor thin film according to the third embodiment to attain the above-described objects is composed of the organic semiconductor materials according to the third embodiment or aspect 3A including the above-mentioned various preferred embodiments and that it has crystallinity.

Also, an organic semiconductor device according to the third embodiment to attain the above-described objects includes the organic semiconductor thin film composed of the organic semiconductor materials according to the third embodiment or the aspect 3A including the above-mentioned various preferred embodiments and that the organic semiconductor thin film has crystallinity.

The fact that "organic semiconductor thin film has crystallinity" means that a solid substance having a spatial periodic atom sequence can take a space lattice structure.

It is desirable that an organic semiconductor thin film should have a stack structure although the present application is not limited thereto. It is known that a pentacene without substituent takes a herringbone structure (see FIG. 7). As compared with this herringbone structure, a stack structure in which benzene rings are stacked in a $\pi$–$\pi$ fashion [crystal structure in which adjacent molecule planes are stacked with each other (adjacent molecule planes have parallel overlapping portions) and refer to FIG. 8] can realize an interaction of a stronger conjugated plane and it has a possibility that it will improve electric characteristics considerably. In the organic semiconductor materials according to aspect 1A, aspect 2A or aspect 3A or the organic semiconductor materials according to the first embodiment, the second embodiment or the third embodiment including the preferred embodiments (hereinafter, these organic semiconductor materials will be generally referred to an "inventive organic semiconductor material"), in the organic semiconductor thin films made of the inventive organic semiconductor material and which are made according to the first embodiment, the second embodiment or the third embodiment including the above-mentioned preferred embodiments (hereinafter, these organic semiconductor thin films will be generally referred to as an "inventive organic semiconductor thin film") and in the organic semiconductor devices including the organic semiconductor thin film made of the organic semiconductor material of the present invention and according to the first embodiment, the second embodiment and the third embodiment including the above-mentioned preferred embodiments (hereinafter, these organic semiconductor devices will be generally referred to as an "inventive organic semiconductor device" and further, the inventive organic semiconductor material, the inventive organic semiconductor thin film and the inventive organic semiconductor device will be simply referred to as the "present invention"), if the organic semiconductor material is constructed by the polyacene derivative into which the substituent is introduced and if the length of the introduced substituent is controlled, then the polyacene can take the herringbone structure and the stack structure. Further, according to the examination done by the inventors of the present application, it became clear from the X-ray crystal structure analysis that, as shown in FIGS. 4 to 6, the organic semiconductor material can take the stack structure rather than the herringbone structure as the length of the substituent is increased. Further, it became clear that, when a substituent is an alkyl group, if a substituent has a length up to the ethyl group (see FIG. 4), then the organic semiconductor material can take the herringbone structure. Also, it became clear that if a substituent has a length longer than a propyl group (refer to FIG. 5 when a substituent is a propyl group and refer to FIG. 6 when a substituent is a butyl group), then the organic semiconductor material can take the stack structure.

An organic semiconductor device according to an embodiment is composed of a source/drain electrode, a channel forming region sandwiched between the source/drain electrode and the source/drain electrode, a gate insulating layer and a gate electrode opposed to the channel forming region through the gate insulating layer, and the channel forming region can be constructed by the organic semiconductor thin film, that is, the organic semiconductor device according to the present invention can be constructed as an organic field-effect transistor (organic FET).

As specific structures of the organic field-effect transistor, the following fours kinds of structures can be shown by way of example.

That is, an organic field-effect transistor having a first structure is a so-called bottom gate/bottom contact type organic field-effect transistor which includes (A) a gate electrode formed on a substrate, (B) a gate insulating layer formed on the gate electrode and the substrate, (C) a source/drain electrode formed on the gate insulating layer and (D) a channel forming region composed of the organic semiconductor thin film according to the present invention formed on the gate insulating layer between the source/drain electrode and the source/drain electrode.

An organic field-effect transistor having a second structure is a so-called bottom gate/top contact type organic field-effect transistor which includes (A) a gate electrode formed on a substrate, (B) a gate insulating layer formed on the gate electrode and the substrate, (C) a channel forming region formed on the gate insulating layer and which is made of the organic semiconductor thin film according to the present invention and (D) a source/drain electrode formed on the organic semiconductor thin film.

Further, an organic field-effect transistor having a third structure is a so-called top gate/top contact type organic field-effect transistor which includes (A) a channel forming region formed on a substrate and which is formed on an organic semiconductor thin film according to the present invention, (B) a source/drain electrode formed on the organic semiconductor thin film, (C) a gate insulating layer formed on the source/drain electrode and the organic semiconductor thin film and (D) a gate electrode formed on the gate insulating layer.

Also, an organic field-effect transistor having a fourth structure is a so-called top gate/bottom contact type organic field-effect transistor which includes (A) a source/drain electrode formed on a substrate, (B) a channel forming region formed on the source/drain electrode and the substrate and which is formed of the organic semiconductor thin film according to the present invention, (C) a gate insulating layer formed on the organic semiconductor thin film and (D) a gate electrode formed on the gate insulating layer.

As the materials constructing the gate insulating layer, not only inorganic insulating materials such as silicon oxide-based materials, silicon nitride ($SiN_Y$), $Al_2O_3$ and a metal oxide high dielectric insulating film but also organic insulating materials such as poly (methyl methacrylate) (PMMA), poly (vinyl phenol) (PVP), poly (ethylene terephthalate) (PET), polyoxymethylene (POM), poly (vinyl chloride) (PVC), poly (vinylidene fluoride), polysulfone, polycarbonate (PC) and polyimide can be enumerated. Also, a combination of the inorganic insulating materials and the organic insulating materials can be used as the material constructing the gate insulating layer. As the silicon oxide-based materials, there can be enumerated silicon dioxide ($SiO_2$), BPSG, PSG, BSG, AsSG, PbSG, silicon oxide and nitride (SiON), SOG (spin-on glass) and low-dielectric constant $SiO_X$-based materials (for example, Poly (aryl ether), cycloperfluoro carbon polymer and benzocyclobutene, cyclic fluororesin, polytetrafluoroethylene, arylether fluoride, poly (imide fluoride), amorphous carbon and organic SOG).

As methods of forming a gate insulating layer, there can be enumerated any one of various kinds of printing methods such as a screen printing method, an ink-jet printing method, an offset printing method and a gravure printing method; various kinds of coating methods such as an air doctor coating method, a blade coating method, a rod coating method, a knife coating method, a squeeze coating method, a reverse roll coating method, a transfer roll coating method, a gravure coating method, a kis coating method, a cast coating method, a spray coating method, a slit orifice coating method, a calender coating method and a die coating method; a dipping method; a casting method; a spin coating method; a spray method; various kinds of CVD (chemical vapor deposition) methods; and various kinds of PVD (physical vapor deposition) methods. As the PVD methods, there can be enumerated various kinds of ion plating methods such as (a) various kinds of vacuum deposition methods such as an electron beam heating method, a resistance heating method and a flash vapor deposition method, (b) a plasma deposition method, (c) various kinds of sputtering methods such as a bipolar sputtering method, a DC sputtering method, a DC magnetron sputtering method, a high-frequency sputtering method, a magnetron sputtering method, an ion beam sputtering method and a bias sputtering method and (d) various kinds of ion plating methods such as a DC (direct current) method, an RF method, a multi-cathode method, an activating reaction method, a field deposition method, a high-frequency ion plating method and a reactive ion plating method.

Alternatively, the gate insulating layer can be formed by oxidizing or nitriding the surface of the gate electrode or the gate insulating layer can be obtained by forming an oxide film or a nitride film on the surface of the gate electrode. As a method of oxidizing the surface of the gate electrode, there can be enumerated a thermal oxidation method, an oxidation method using $N_2$ plasma and an anode oxidation method depending on materials constructing the gate electrode. As a method of nitriding the surface of the gate electrode, there can be enumerated a nitriding method using $N_2$ plasma depending on the materials constructing the gate electrode. Alternatively, when the gate electrode is made of gold (Au), it is possible to form the gate insulating layer on the surface of the gate electrode by coating the surface of the gate electrode in a self-organization fashion with a suitable method such as a dipping method based on insulating molecule having functional groups capable of chemically forming bonds with the gate electrode like a straight hydrocarbon of which one end is modified by a mercapto group.

Further, as the materials constructing the gate electrode, the source/drain electrode and various kinds of wirings, there can be enumerated platinum (Pt), gold (Au), palladium (Pd), chrome (Cr), nickel (Ni), molybdenum (Mo), niobium (Nb), neodymium (Nd), aluminum (Al), silver (Ag), tantalum (Ta), tungsten (W), copper (Cu), rubidium (Rb), rhodium (Rh), titanium (Ti), indium (In) and tin (Sn) or alloys containing these metal elements, conducting particles made of these metals, conducting particles of alloys containing these metals, polysilicon, amorphous silicon, tin oxide, indium oxide and indium tin oxide (ITO) or a laminating structure of layers containing these elements. Further, as the materials constructing the gate electrode, the source/drain electrode and various kinds of wirings, there can be enumerated organic conducting materials such as poly (3,4-ethylenedioxythiophene)/poly (styrene sulfonic acid) (PEDOT/PSS).

As methods of forming the source/drain electrode, the gate electrode and various kinds of wirings, depending on materials constructing the source/drain electrode, the gate electrode and various kinds of wirings, there can be used any one of a spin coating method; the above-mentioned various kinds of printing methods using various conducting pastes and various conducting polymer solutions; the above-mentioned various kinds of coating methods; a lift-off method; a shadow mask method; an electrolytic plating method, a nonelectrolytic plating or a plating method of a combination of the electrolytic plating and the nonelectrolytic plating; a spray method; the above-mentioned various kinds of PVD methods; and various kinds of CVD methods including an MOCVD (metal organic chemical vapor deposition) method or combinations of the above-mentioned methods and patterning technologies if necessary.

As the substrate, there can be enumerated various kinds of glass substrates, various kinds of glass substrates with insulating films formed on their surfaces, a quartz substrate, a quartz substrate with an insulating film formed on its surface and a silicon substrate with an insulating film formed on its surface. Further, as the substrate, there can be enumerated plastic films and plastic sheet plastic substrates consisting of polymer materials such as polyethersulfone (PES), polyimide, polycarbonate (PC), poly (ethylene terephthalate) (PET), poly (methyl methacrylate) (PMMA), poly (vinyl alcohol) (PVA), poly (vinyl phenol) (PVP). If a substrate consisting of polymer materials with flexibility is used, then an organic semiconductor device can be assembled into or unitarily formed with display apparatus and electronic devices having curved-surface shapes. In addition, conducting substrates (substrates made of metals such as gold and graphite with high orientation) can be enumerated as the substrate. Also, it is frequently observed that an organic semiconductor device is provided on a supporting member depending on the arrangement and structure of the organic semiconductor device. The supporting member in such a case also can be constructed by the above-mentioned materials.

When the organic semiconductor device is applied to and used with display apparatus and various kinds of electronic devices, the organic semiconductor device can be formed as a monolithic integrated circuit in which a large number of organic semiconductor devices are integrated on the substrate. Each organic semiconductor device can be cut and separately used as discrete assemblies. Also, the organic semiconductor device can be shielded by a resin.

According to an embodiment, since the organic semiconductor material is constructed by the polyacene derivative into which the substituent is introduced, affinity of the organic semiconductor material relative to an organic solvent can be improved and it becomes possible to dissolve the organic semiconductor material into a wide variety of organic solvents at room temperature. Thus, at room temperature, organic semiconductor materials of quantities required by coating processes such as a spin coating method; a dipping (dip coating) method; various kinds of coating methods such as an air doctor coating method, a blade coating method, a rod coating method, a knife coating method, a squeeze coating method, a reverse roll coating method, a transfer roll coating method, a gravure coating method, a kis coating method, a cast coating method, a spray coating method, a slit orifice coating method, a calender coating method and a die coating method; various kinds of printing methods such as a screen printing method, an ink-jet printing method, an offset printing method and a gravure printing method; a casting method; and a spray method can be dissolved into a wide variety of organic solvents such as hydrocarbon-based solvents (for example, hexane, heptane, octane, cyclohexane), ester-based solvents (for example, ethyl acetate, butyllactone), alcohol-based solvents (for example, octanol, hexanol, benzyl alcohol), aromatic-based solvents (for example, toluene, mesitylene, benzene), ether-based solvents (for example, diethyl ether, tetrahydrofuran), halogen-based solvents (for example, chloroform, dichloromethane) and ketone-based solvents (for example, acetone, cyclopentanone).

A polyacene compound is a compound in which benzene rings are bonded in a straight fashion and a polyacene compound without substituent has properties in which it becomes more difficult to be dissolved into an organic solvent in accordance with the increase of the number of benzene rings. In particular, a polyacene greater than pentacene having five benzene rings bonded loses solubility relative to almost all of organic solvents and it is difficult to form a uniform film based on a suitable method such as a spin coating method. If possible, then it is unavoidable that the organic solvent available in this case is limited to extremely limited organic solvents and temperature conditions. However, according to an embodiment, since the organic semiconductor material consists of the polyacene derivatives into which the substituents were introduced, it is possible to improve solubility of the organic semiconductor material relative to various kinds of organic solvents. Hence, it is possible to form/deposit a uniform film based on the coating process such as the spin coating method. As earlier noted, since 2,3,9,10-tetramethyl pentacene and 2,3-dimethyl pentacene are known well, it has been reported that, if 1,2-dichlorobenzene with high extractability is used, then the organic semiconductor material is slightly dissolved in the state in which it is warmed. Therefore, it can be gathered from this report that introduction of substituents into the polyacene derivatives in the organic semiconductor material considerably affects solubility of the organic semiconductor materials into the organic solvents.

Also, according to an embodiment, not only the solubility of the organic semiconductor material with respect to the organic solvent can be improved but also oxidation resistance can be improved and control of packing rules (herringbone structure/stack structure) in the organic semiconductor thin film and crystallinity can be improved by the introduction of substituents. Further, by using the polyacene derivative in which a substituent with a polarity and a substituent without polarity are introduced into desired positions, it becomes possible to control orientation and inclination of the organic semiconductor material relative to a base material (underlying layer or substrate). Also, it becomes possible to carry out patterning on the organic semiconductor material by bonding the polyacene derivative to functional groups introduced into desired positions of a base material (underlying layer or substrate). Further, the polyacene derivatives have a possibility that they will change their conductivity types depending on the substituents. It is known that, while ordinary pentacene without substituent behaves as a p-type semiconductor, pentacene in which all hydrogen atoms are replaced with fluorine atoms acts as an n-type semiconductor. Then, according to the present invention, since the organic semiconductor material is formed as the polyacene derivative into which the substituents are introduced, electron transition energy is changed with the result that it becomes possible to control a conductivity type.

Additional features and advantages are described herein, and will be apparent from, the following Detailed Description and the figures.

DETAILED DESCRIPTION

Figure 1A:
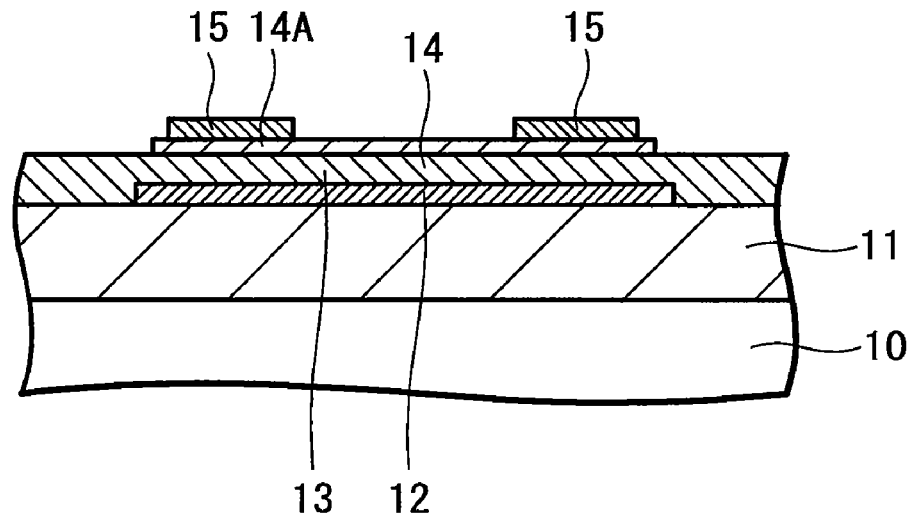
FIG. 1A is a schematic cross-sectional view showing a part of an organic field-effect transistor which is which might be called a bottom gate/top contact type organic field-effect transistor.

Embodiments of the present invention will be described below in detail with reference to the drawings.

Example 1

Example 1 relates to an organic semiconductor material, an organic semiconductor thin film and an organic semiconductor device according to a first or second mode of the present invention. A chemical formula of the organic semiconductor material according to the inventive example 1 is shown as follows.

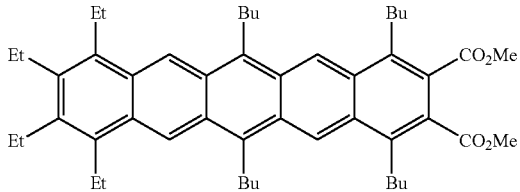

The organic semiconductor material of the inventive example 1 is made of a polyacene derivative shown by the following general formula (1). In the general formula (1), $R_1$, $R_2$, $R_3$, $R_4$, $R_5$, $R_6$, $R_7$, $R_8$, $R_9$ and $R_{10}$ are respectively substituents which will follow. That is, the organic semiconductor material of the inventive example 1 is 2,3-bis methoxycarbonyl-1,4,6,13-tetrabutyl-8,9,10,11-tetraethyl pentacene.

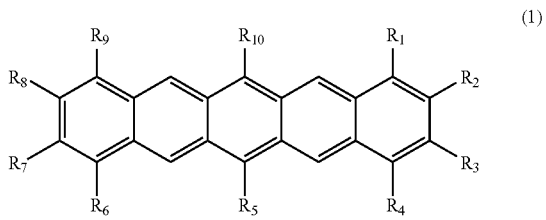

$R_1$: aliphatic hydrocarbon group (concretely, butyl group)
$R_2$: carbonyl group (concretely, methoxycarbonyl group)
$R_3$: carbonyl group (concretely, methoxycarbonyl group)
$R_4$: aliphatic hydrocarbon group (concretely, butyl group)
$R_5$: aliphatic hydrocarbon group (concretely, butyl group)
$R_6$: aliphatic hydrocarbon group (concretely, ethyl group)
$R_7$: aliphatic hydrocarbon group (concretely, ethyl group)
$R_8$: aliphatic hydrocarbon group (concretely, ethyl group)
$R_9$: aliphatic hydrocarbon group (concretely, ethyl group)
$R_{10}$: aliphatic hydrocarbon group (concretely, butyl group)

Alternatively, the organic semiconductor material according to example 1 is made of a polyacene derivative shown by the following general formula (2). $R_1$, $R_2$, $R_3$, $R_4$, $R_5$, $R_6$, $R_7$ and $R_8$ in the general formula (2) are the following substituents, respectively. In the inventive example 1, an equality of n=4 is satisfied. Also, $R_5$ is expressed as $R_{51}$, $R_{52}$, $R_{53}$, $R_{54}$ in the clockwise direction of the general formula, and $R_8$ is expressed as $R_{81}$, $R_{82}$, $R_{83}$, $R_{84}$ in the clockwise direction of the general formula. This relationship will apply for the following examples as well.

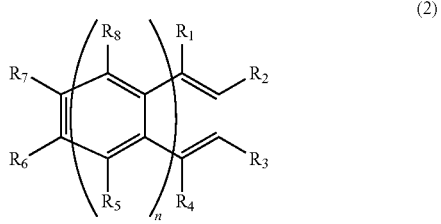

$R_1$: aliphatic hydrocarbon group (concretely, butyl group)
$R_2$: carbonyl group (concretely, methoxycarbonyl group)
$R_3$: carbonyl group (concretely, methoxycarbonyl group)
$R_4$: aliphatic hydrocarbon group (concretely, butyl group)
$R_{51}$: hydrogen atom $R_{52}$: aliphatic hydrocarbon group (concretely, butyl group)
$R_{53}$: hydrogen atom
$R_{54}$: aliphatic hydrocarbon group (concretely, ethyl group)
$R_6$: aliphatic hydrocarbon group (concretely, ethyl group)
$R_7$: aliphatic hydrocarbon group (concretely, ethyl group)
$R_{81}$: aliphatic hydrocarbon group (concretely, ethyl group)
$R_{82}$: hydrogen atom
$R_{83}$: aliphatic hydrocarbon group (concretely, butyl group)
$R_{84}$: hydrogen atom The organic semiconductor thin film according to example 1 is made of the above-described organic semiconductor material and has crystallinity. Also, the organic semiconductor device according to example 1 is made of the above-described organic semiconductor material and includes the organic semiconductor thin film having the crystallinity.

Specifically, an organic field-effect transistor according to example 1 is composed of a source/drain electrode 15, a channel forming region 14 sandwiched by the source/drain region 15 and the source/drain region 15, a gate insulating layer 13 and a gate electrode 12 opposed to the channel forming region 14 through the gate insulating layer 13. More specifically, as FIG. 1A shows a schematic fragmentary cross-sectional view, an organic field-effect transistor of a so-called bottom gate/top contact type according to example 1 is composed of (a) a gate electrode 12 formed on substrates 10 and 11 and which is formed of a metal film, (b) a gate insulating layer 13 formed on the gate electrode 12 and the substrates 10 and 11 and which is made of $SiO_2$, (c) a channel forming region 14 and a channel forming region extended portion 14A formed on the gate insulating layer 13 and which are formed of the organic semiconductor thin film of example 1 and (d) a source/drain electrode 15 formed on the channel forming region extended portion 14A and which is formed of a metal film. The substrates 10 and 11 are formed of the substrate 10 made of a glass substrate and a $SiO_2$ insulating film 11 formed on the surface of the substrate 10. To be more concrete, the gate electrode 12 and the gate insulating layer 13 are formed on the insulating film 11.

An outline of a method of manufacturing a so-called bottom gate/top contact type organic field-effect transistor (specifically, TFT (thin-film transistor) using the organic semiconductor material according to example 1 will be described below.

[Process-100]

First, the gate electrode 12 is formed on the substrate (glass substrate 10 and on which surface there is formed the $SiO_2$ insulating film 11). Specifically, a resist layer (not shown) in which a portion on which the gate electrode 12 should be formed is removed is formed on the insulating film 11 by a lithography technique. After that, a chromium (Cr) layer (not shown) that serves as a close-contact layer and a gold (Au) layer that servers as the gate electrode 12 are sequentially deposited on the whole surface by a vacuum evaporation coating process and then the resist layer is removed. In this manner, the gate electrode 12 can be obtained by a so-called lift off method.

[Process-110]

Next, the gate insulating film 13 is formed on the substrate (insulating film 11) which includes the gate electrode 12. Specifically, the gate insulating film 13 made of $SiO_2$ is deposited on the gate electrode 12 and the insulating film 11 based on a sputtering method. When the gate insulating film 13 is deposited on the gate electrode 12 and the insulating film 11, if a part of the gate electrode 12 is covered with a hard mask, then it is possible to form a lead-out portion (not shown) of the gate electrode 12 without photolithography process.

[Process-120]

Next, the channel forming region 14 and the channel forming region extended portion 14A are formed on the gate insulating layer 13. Specifically, a solution in which 5 g of the organic semiconductor material of the inventive example 1 that has been described before was dissolved into 1 liter of a chloroform solution is coated on the gate insulating film 13 at room temperature by a coating process such as a spin coating method. Subsequently, when the above coated solution is dried by a heating treatment at 60° C., the channel forming region 14 and the channel forming region extended portion 14A can be formed on the gate insulating layer 13. According to the results of various experiments, it is to be understood that organic field-effect transistors obtained under the condition in which a temperature in which the coated solution is to be dried lies in a range of from 60° C.±5° C. exhibited best transistor characteristics.

[Process-130]

After that, the source/drain electrodes 15 are formed on the channel forming region extended portion 14A so as to sandwich the channel forming region 14 there between. Specifically, a chromium (Cr) layer (not shown) that serves as the close-contact layer and a gold (Au) layer that serves as the source/drain electrode 15 are sequentially deposited on the whole surface on the basis of the vacuum evaporation coating process. In this manner, the structure shown in FIG. 1A can be obtained. When the gate insulating film 13 is deposited on the gate electrode 12 and the insulating film 11, if a part of the channel forming region extended portion 14A is covered with a hard mask, then it is possible to form the source/drain electrode 15 without photolithography process.

[Process-140]

Last, after an insulating layer (not shown) that serves as a passivation film was formed on the whole surface, an opening portion was formed on the insulating layer above the source/drain electrode 15 and an interconnection material layer was formed on the whole surface including the inside of the opening portion, by treating the interconnection material layer via a patterning process, it is possible to obtain a bottom gate/top contact type organic field-effect transistor in which an interconnection (not shown) connected to the source/drain electrode 15 is formed on the insulating layer.

The organic field-effect transistor is not limited to the so-called bottom gate/top contact type organic field-effect transistor and it can be applied to various kinds of other organic field-effect transistors, such as a so-called bottom gate/bottom contact type organic field-effect transistor, a so-called top gate/top contact type organic field-effect transistor and a so-called top gate/bottom contact type organic field-effect transistor.

Figure 1B:
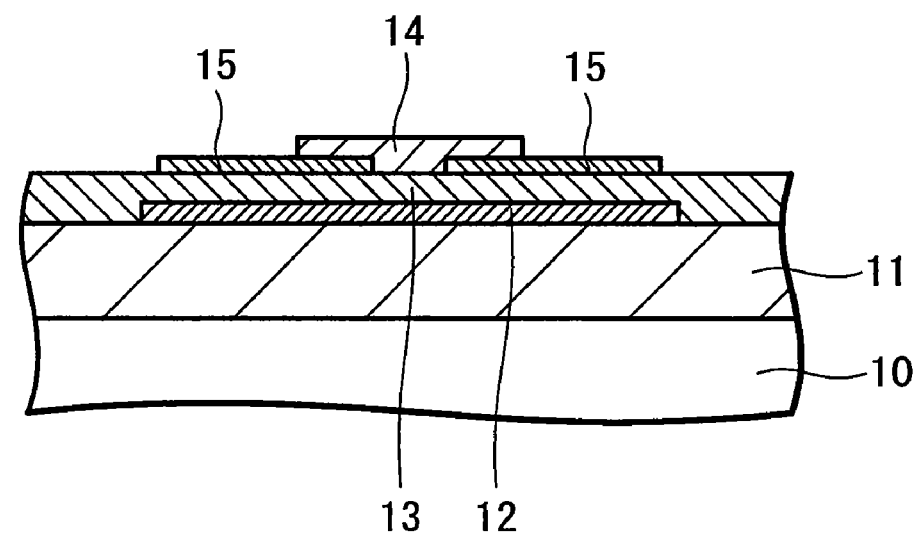
FIG. 1B is a schematic cross-sectional view showing a part of an organic field-effect transistor which is what might be called a bottom gate/bottom contact type organic field-effect transistor.

FIG. 1B is a schematically cross-sectional view showing a part of a so-called bottom gate/bottom contact type organic field-effect transistor. In FIG. 1B, elements and parts identical to those of FIG. 1A are denoted by identical reference numerals. As shown in FIG. 1B, this bottom gate/bottom contact type organic field-effect transistor includes (a) the gate electrode 12 formed on the substrates 10 and 11, (b) the gate insulating layer 13 formed on the gate electrode 12 and the substrates 10 and 11, (c) the source/drain electrode 15 formed on the gate insulating layer 13 and (d) the channel forming region 14 formed on the gate insulating layer 13 at its portion sandwiched between the source/drain electrodes 15 and 15.

An outline of a method for manufacturing a bottom gate/bottom contact type TFT will be described below.

[Process-200]

First, after the gate electrode 12 was formed on the substrate (insulating film 11) similarly to the [process-100], the gate insulating layer 13 is formed on the gate electrode 12 and the insulating film 11 similarly to the [process-110].

[Process-210]

Next, the source/drain electrode 15 formed of a gold (Au) layer is formed on the gate insulating layer 13. Specifically, the resist layer in which a portion on which the source/drain electrode 15 should be formed is removed is formed on the gate insulating layer 13 by the lithography technique. Then, similarly to the [process-100], the chromium (Cr) layer (not shown) that serves as the close-contact layer and the gold (Au) layer that serves as the source/drain electrode 15 are sequentially deposited on the resist layer and the gate insulating layer 13 by the vacuum evaporation coating process and then the resist layer is removed. In this manner, the source/drain electrode 15 can be obtained based on the so-called lift off method.

[Process-220]

After that, based on a method similar to that of the [process-120], the channel forming region 14 is formed on the gate insulating layer 13 at its portion sandwiched between the source/drain electrodes 15 and 15. In this manner, it is possible to obtain the structure shown in FIG. 1B.

[Process-230]

Finally, it is possible to obtain the bottom gate/bottom contact type organic field-effect transistor by executing a process similar to that of the [process-140].

Figure 2A:
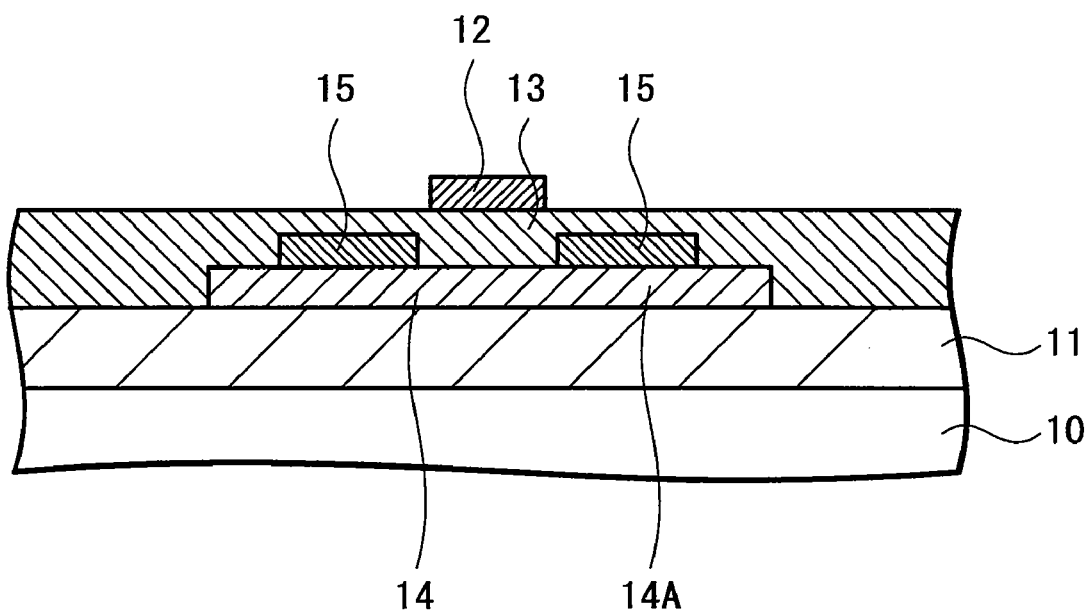
FIG. 2A is a schematic cross-sectional view showing a part of an organic field-effect transistor which is what might be called a top gate/top contact type organic field-effect transistor.

FIG. 2A is a schematic cross-sectional view showing a part of a so-called top gate/top contact type organic field-effect transistor. In FIG. 2A, elements and parts identical to those of FIG. 1A are denoted by identical reference numerals.

As shown in FIG. 2A, this top gate/top contact type organic field-effect transistor includes (a) the channel forming region 14 and the channel forming region extended portion 14A formed on the substrates 10 and 11, (b) the source/drain electrode 15 formed on the channel forming region extended portion 14A, (c) the gate insulating layers 13 formed on the source/drain electrode 15 and the channel forming region 14(*a*) the channel forming region 14 and the channel forming region extended portion 14A formed on the substrates 10 and 11, (b) the source/drain electrode 15 formed on the channel forming region extended portion 14A, (c) the gate insulating layers 13 formed on the source/drain electrode 15 and the channel forming region 14 and (d) the gate electrode 12 formed on the gate insulating layer 13.

An outline of a method of manufacturing a top gate/top contact type TFT will be described below.

[Process-300]

First, the channel forming region 14 and the channel forming region extended portion 14A are formed on the substrate (the glass substrate 10 and on which surface there is formed the insulating film 11 made of $SiO_2$) on the basis of a method similar to that of the [process-120].

[Process-310]

Next, the source/drain regions 15 and 15 are formed on the channel forming region extended portion 14A so as to sandwich the channel forming region 14 there between. Specifically, the chromium (Cr) layer (not shown) that serves as the close-contact layer and the gold (Au) layer that serves as the source/drain electrode 15 are deposited on the whole surface, in that order, by the vacuum evaporation coating process. When the source/drain electrodes 15 are deposited on the channel forming region extended portion 14A, if a part of the channel forming region extended portion 14A is covered with a hard mask, then it is possible to form the source/drain electrodes 15 without photolithography process.

[Process-320]

Next, the gate insulating layer 13 is formed on the source/drain electrode 15 and the channel forming region 14. Specifically, it is possible to form the gate insulating layer 13 on the source/drain electrode 15 and the channel forming region 14 by depositing PVA (poly (vinyl alcohol)) on the whole surface based on the spin coating method.

[Process-330]

After that, the gate electrode 12 is formed on the gate insulating layer 13. Specifically, the chromium (Cr) layer (not shown) that serves as the close-contact layer and the gold (Au) layer that serves as the gate electrode 12 are deposited on the whole surface, in that order, by the vacuum evaporation coating process. In this manner, it is possible to obtain the structure shown in FIG. 2A. When the gate electrode 12 is deposited on the gate insulating layer 13, if a part of the gate insulating layer 13 is covered with the hard mask, then it is possible to form the gate electrode 12 without photolithography process. Last, it is possible to obtain the top gate/top contact type organic field effect transistor by executing a process similar to that of the [process-140].

Figure 2B:
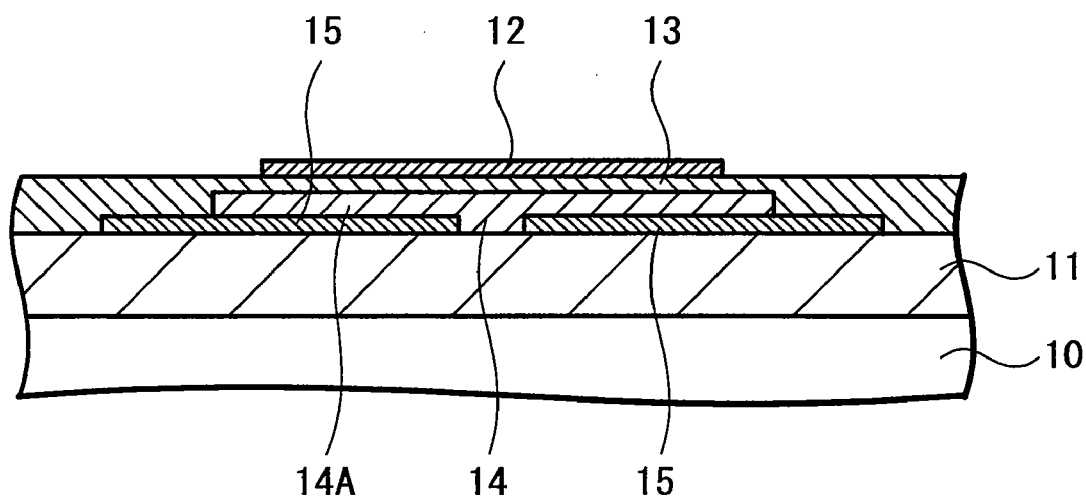
FIG. 2B is a schematic cross-sectional view showing a part of an organic field-effect transistor which is what might be called a top gate/bottom contact type organic field-effect transistor.

FIG. 2B is a schematic cross-sectional view showing a part of the so-called top gate/bottom contact type organic field-effect transistor. In FIG. 2B, elements and parts identical to those of FIG. 2A are denoted by identical reference numerals.

As shown in FIG. 2B, this top gate/bottom contact type organic field-effect transistor includes (a) the source/drain electrodes 15 formed on the substrates 10 and 11, (b) the channel forming region 14 formed on the substrates 10 and 11 at their portions sandwiched by the source/drain electrodes 15 and 15, (c) the gate insulating layer 13 formed on the channel forming region 14 and (d) the gate electrode 12 formed on the gate insulating layer 13.

An outline of a method of manufacturing a top gate/bottom contact type TFT will be described below.

[Process-400]

First, the source/drain electrode 15 is formed on the substrate (the glass substrate 10 and on which surface there is formed the insulating film 11 made of $SiO_2$). Specifically, the chromium (Cr) layer (not shown) that serves as the close-contact layer and the gold (Au) layer that serves as the source/drain electrode 15 are deposited on the insulating film 11 by the vacuum evaporation coating process. When the source/drain electrode 15 is deposited on the insulating film 11, if a part of the substrate (insulating film 11) is covered with the hard mask, then it is possible to form the source/drain electrode 15 without photolithography process.

[Process-410]

After that, the channel forming region 14 is formed on the substrate (the insulating film 11) at its portion sandwiched by the source/drain electrodes 15 on the basis of a method similar to that of the [process-120]. In actual practice, the channel forming region extended portion 14A is formed on the source/drain electrode 15.

[Process-420]

Next, the gate insulating layer 13 is formed on the source/drain electrode 15 and the channel forming region 14 (in actual practice, the gate insulating layer 13 is formed on the channel forming region 14 and the channel forming region extended portion 14A) similarly to the process-320].

[Process-430]

After that, similarly to the process-330], the gate electrode 12 is formed on the gate insulating layer 13. In this manner, it is possible to obtain the structure shown in FIG. 2B. Last, it is possible to obtain the top gate/bottom contact type organic field-effect transistor by executing a process similar to that of the [process-140].

Also in the inventive examples 2 to 10 which will follow, the organic field-effect transistor can be formed as any one of the bottom gate/top contact type organic field-effect transistor, the bottom gate/bottom contact type organic field-effect transistor, the top gate/top contact type organic field-effect transistor and the top gate/bottom contact type organic field-effect transistor and they can be manufactured based on the above-mentioned methods.

Figure 3:
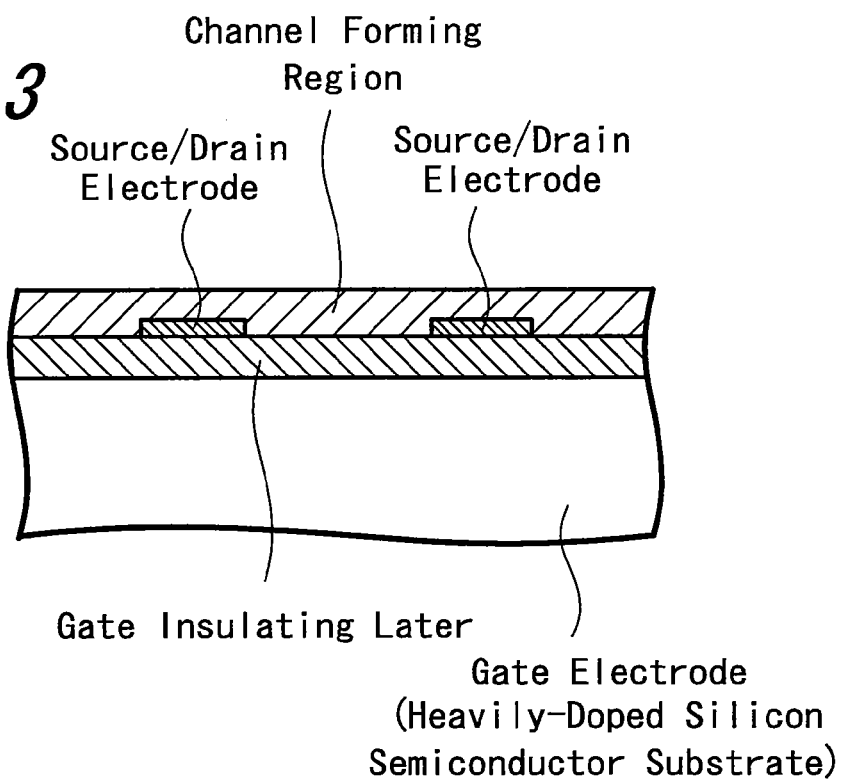
FIG. 3 is a schematic cross-sectional view showing a part of organic field-effect transistor test products according to respective inventive examples.
Figure 4:
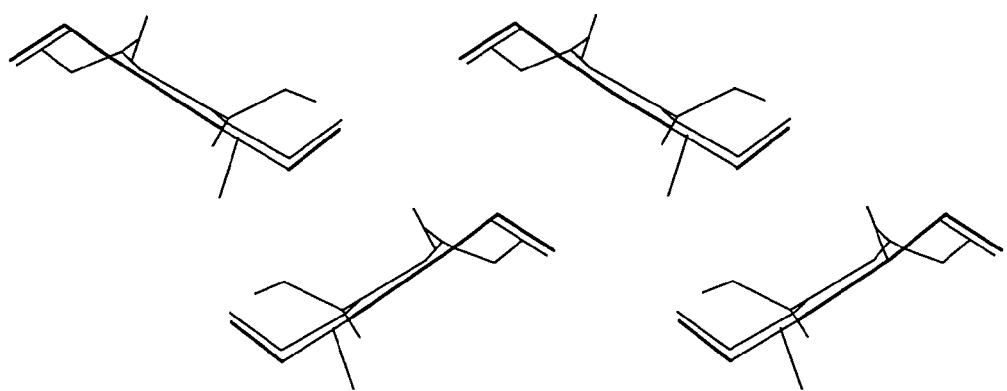
FIG. 4 is a diagram showing an X-ray crystalline structure analysis of an organic semiconductor material in the form of a photograph in which a substituent is an ethyl group.
Figure 5:
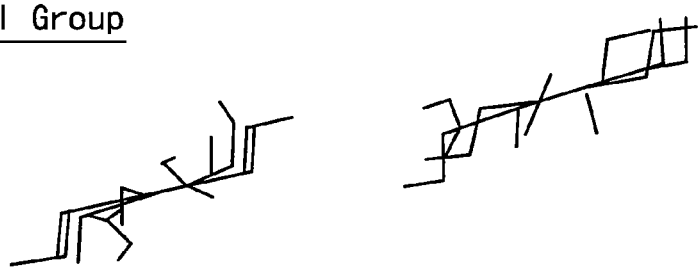
FIG. 5 is a diagram showing an X-ray crystalline structure analysis of an organic semiconductor material in the form of a photograph in which a substituent is a propyl group.
Figure 5:
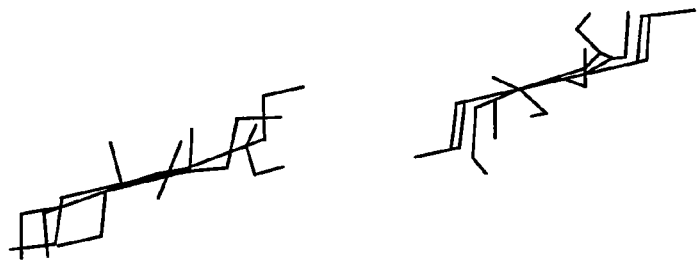
Figure 6:
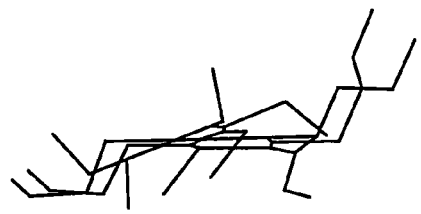
FIG. 6 is a diagram showing an X-ray crystalline structure analysis of an organic semiconductor material in the form of a photograph in which a substituent is a butyl group.
Figure 6:
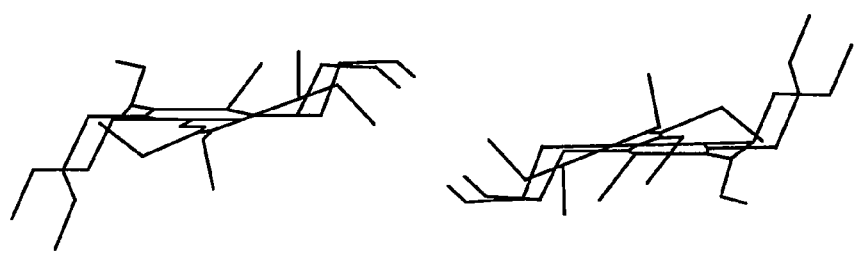
Figure 6:
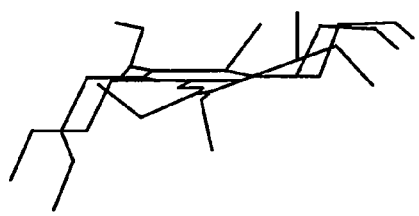
Figure 7:
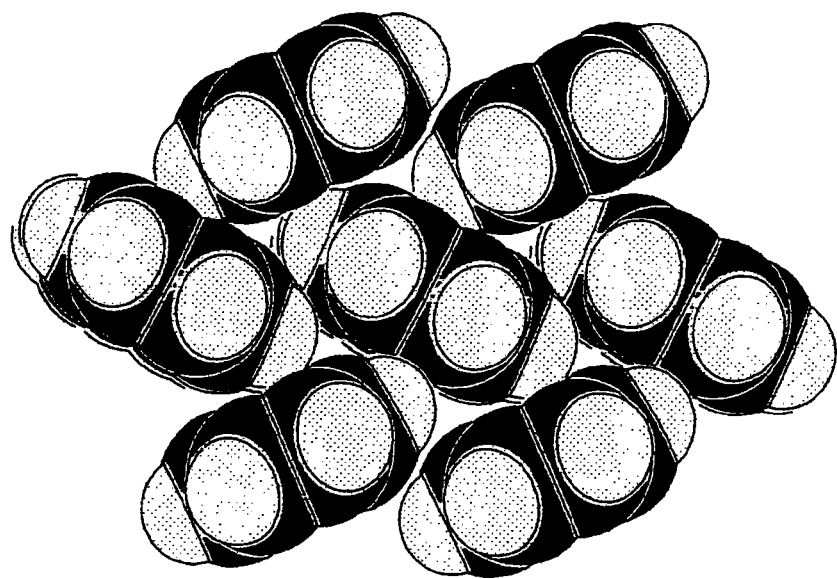
FIG. 7 is a diagram showing a herringbone structure which is a laminating structure of a molecule in an organic compound crystal.
Figure 8:
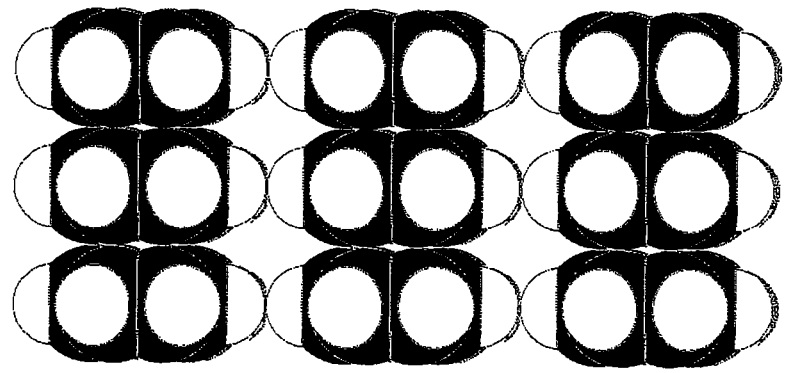
FIG. 8 is a diagram showing a stack structure of a laminating structure of a molecule in an organic compound crystal.

Operations of a test product of an organic field-effect transistor having a channel forming region, which was formed based on a coating process such as a spin coating method using a chloroform solution (concentration: 5 g/lit.) of the organic semiconductor material of the inventive example 1 at room temperature, were checked. FIG. 3 is a schematic cross-sectional view showing a part of the above test product of the organic field-effect transistor. As a result, gate modulation could be confirmed and hence it could be confirmed that the organic semiconductor thin film played a role of the channel forming region. Depending on the conditions of the spin coating and the like, mobility of $5.0 \times 10^{-5}$ to $1.2 \times 10^{-3}$ cm$^2 \cdot$V$^{-1} \cdot$second$^{-1}$ could be obtained as mobility in the saturation region at that time.

Further, the organic semiconductor materials of the inventive example 1 were prepared at room temperature in which ethyl acetate, acetone, toluene, tetrahydrofuran, tetrahydropyran, cyclopentane and mesitylene were used as solvents instead of chloroform (concentration: 5 g/lit.). Then, organic field-effect transistor test products were manufactured by using the above respective prepared solutions based on the similar methods and operations of the thus manufactured organic field-effect transistor test products were checked. As a result, organic semiconductors could be formed and deposited even when any prepared solution was used. Further, gate modulation could be confirmed and hence it could be confirmed that the organic semiconductor thin film played a role of the channel forming region.

A method of synthesizing polyacene derivatives constructing the organic semiconductor materials of the inventive example 1 will be described below. Until otherwise specified, operations concerning synthesis were carried out under the atmosphere of an inert gas by using deoxidized and dehydrated solvents. Also, with respect to a synthesis scheme, refer to J. Am. Chem. Soc. 112, 12876-12877 (2000).

[Operation-10]

First, 8.8 g of $Cp_2ZrCl_2$ was dissolved into 100 ml of tetrahydrofuran (THF) and cooled to −78° C. After that, 38 ml of n-BuLi hexane solution (1.6 mol/lit) was added to the resultant solution and stirred at −78° C. for one hour. After 6.9 ml of 3-hexyne was added to the resultant solution and stirred at room temperature for three hours, whereafter 6.0 g of copper (I) chloride and 1 ml of Dimethyl acetylenedicarboxylate (hereinafter referred to as a "DMAD") was added to the resultant solution and stirred at room temperature for three hours. Subsequently, 3N hydrochloric acid was added to the resultant solution and reaction was ended. The resultant product was extracted three times by using 100 ml of hexane solution, sequentially rinsed with saturated sodium hydrogencarbonate and saturated brine and then dried by using magnesium sulfate. After that, a solvent is removed from the resultant product and refined by column chromatography (developing solvent): ethyl acetate/hexane=1/5) and thereby 5.6 g of the following compound (1.1) could be obtained as a solid material (isolated yield: 61%)

[OPERATION-11]

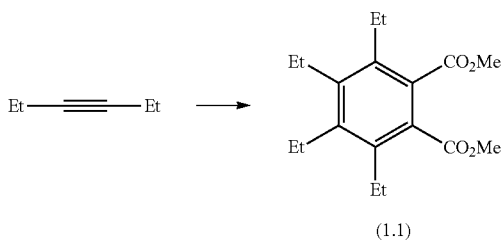

(1.1)

Next, 1.0g of LiAlH$_4$ was added to 47 ml of THF cooled at 0° C. and 4.2 g of a compound (1.1) was added to this solution at 0° C. Then, after the resultant solution was stirred at room temperature for three hours, water was added to this resultant solution and reaction was ended. Next, 2N sulfuric acid was added to the resultant solution so that the resultant solution may become slightly acid. This solution was extracted three times by using 50 ml of diethyl ether, rinsed with saturated brine and then dried by using magnesium sulfate. Then, after the solvent was dried by the evaporator, the resultant solvent was recrystallized and thereby 3.0 g of a compound (1.2) could be obtained as a solid crystal (yield: 90%).

[OPERATION-12]

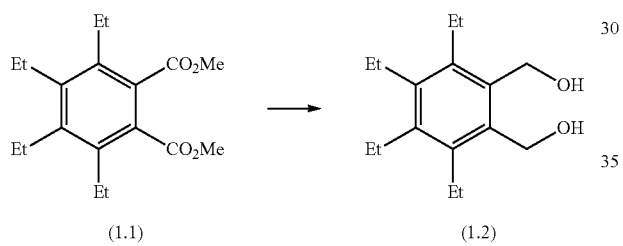

(1.1)                                    (1.2)

After that, 3.0 g of a compound (1.2) was dissolved into 45 ml of chloroform to which 1.5 ml of PBr$_3$ was added. Then, after the solution was stirred at room temperature for three hours, water was added to the resultant solution. Then, the resultant solution was extracted three times by 50 ml of ethyl acetate, sequentially rinsed with saturated sodium hydrogencarbonate and saturated brine and then dried by using magnesium sulfate. Subsequently, the solvent was removed from the resultant solution by using the evaporator and recrystallized by hexane and thereby 4.5 g of a compound (1.3) could be obtained as a white solid (yield: 99%).

[OPERATION-13]

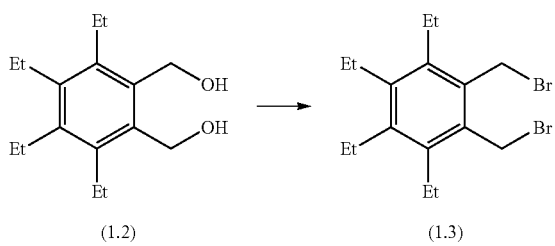

(1.2)                                    (1.3)

Next, 4.0 ml of 1-hexyne was added to 100 ml of THF. In the state in which a resultant solution was cooled at −78° C., 20 ml of n-BuLi hexane solution (1.6 mol/lit.) was added to the resultant solution and stirred at room temperature for one hour. After that, in the state in which a reaction solution was cooled at −78° C., 3.7 ml of DMPU and 3.0 g of dibromo material [compound (1.3)] dissolved into THF were added to the resultant solution and stirred at room temperature for three hours. Next, 3N hydrochloric acid was added to the resultant solution and then reaction was ended. Next, the resultant solution was extracted three times by 100 ml of hexane, sequentially rinsed with saturated sodium hydrogencarbonate and saturated brine and then dried by using magnesium sulfate. Subsequently, the solvent was removed from the resultant solution by using the evaporator and refined by the column chromatography (developing solvent: ethyl acetate/hexane=1/10) and thereby 2.6 g of a compound (1.4) could be obtained (yield: 83%)

[OPERATION-14]

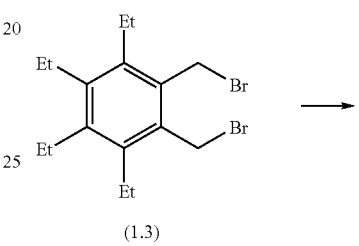

(1.3)

(1.4)

After that, after 0.29 g of Cp$_2$ZrCl$_2$ was dissolved into 5.0 ml of THF and cooled at −78° C., 1.3 ml of n-BuLi hexane solution (1.6 mol/lit.) was added to the resultant solution and the resultant solution was stirred at −78° C. for one hour. Next, 0.38 g of compound (1.4) in the state in which it was dissolved into the THF was added to the resultant solution and stirred at room temperature for three hours. Thereafter, 6.0 g of copper (I) chloride was added to the resultant solution and the resultant solution was cooled at 0° C. After that, 11 ml of DMAD was added to the resultant solution and stirred at room temperature for three hours. Then, 3N hydrochloric acid was added to the resultant solution and then reaction was ended. Next, the resultant solution was extracted three times by 20 ml of hexane, sequentially rinsed with saturated sodium hydrogencarbonate and saturated brine and then dried by using magnesium sulfate. Subsequently, the solvent was removed from the resultant solution by using the evaporator and refined by the column chromatography (developing solvent: ethyl acetate/hexane=1/10) and thereby 0.49 g of a compound (1.5) could be obtained as a solid material (isolated yield: 95%).

[OPERATION-15]

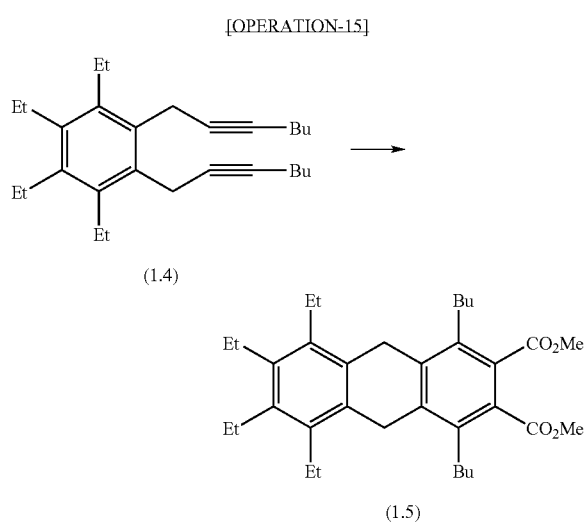

(1.4) → (1.5)

Next, 5.0 g of a compound (1.5) and 2.2 g of DDQ were dissolved into 100 ml of toluene and refluxed for three hours. After that, the filtered solution was distilled under reduced pressure. Then, the resultant solid was refined by the column chromatography (developing solvent: ethyl acetate/hexane=1/9) and 4.9 g of a compound (1.6) could be obtained as a solid material (yield: 99%).

[OPERATION-16]

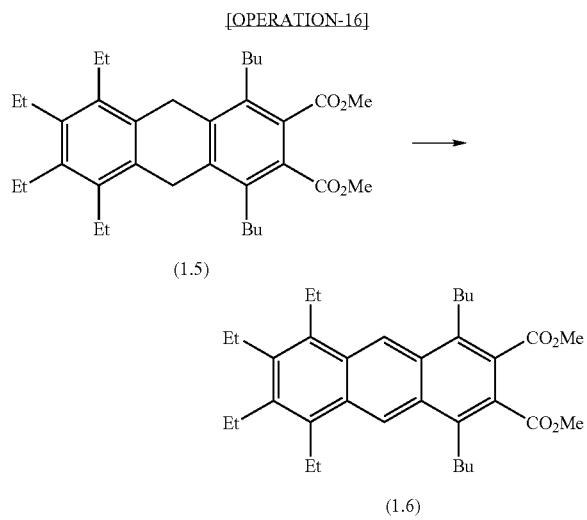

(1.5) → (1.6)

Next, 0.72 g of LiAlH$_4$ was added to 150 ml of THF cooled at 0° C. and 4.9 g of a compound (1.6) was added to this solution at 0° C. Then, after the resultant solution was stirred at room temperature for three hours, water was added to this resultant solution and reaction was ended. Then, 2N sulfuric acid was added to the resultant solution so that the resultant solution may become slightly acid. This solution was extracted three times by using 100 ml of diethyl ether, rinsed with the saturated brine and then dried by using magnesium sulfate. Then, after the solvent was distillated under reduced pressure by the evaporator, 40 ml of chloroform was added to the resultant solution into which 0.95 ml of PBr$_3$ was added. Then, after the resultant solution was stirred at room temperature for 12 hours, water was added to the resultant solution and reaction was ended. Then, the resultant solution was extracted three times by using 100 ml of ethyl acetate, sequentially rinsed with saturated sodium hydrogencarbonate and saturated brine and dried by using magnesium sulfate. Thereafter, after the solvent was removed from the resultant solution by the evaporator, the resultant solution was recrystallized by hexane and thereby 5.6 g of a compound (1.8) could be obtained as a white solid (yield: 99%).

[OPERATION-17]

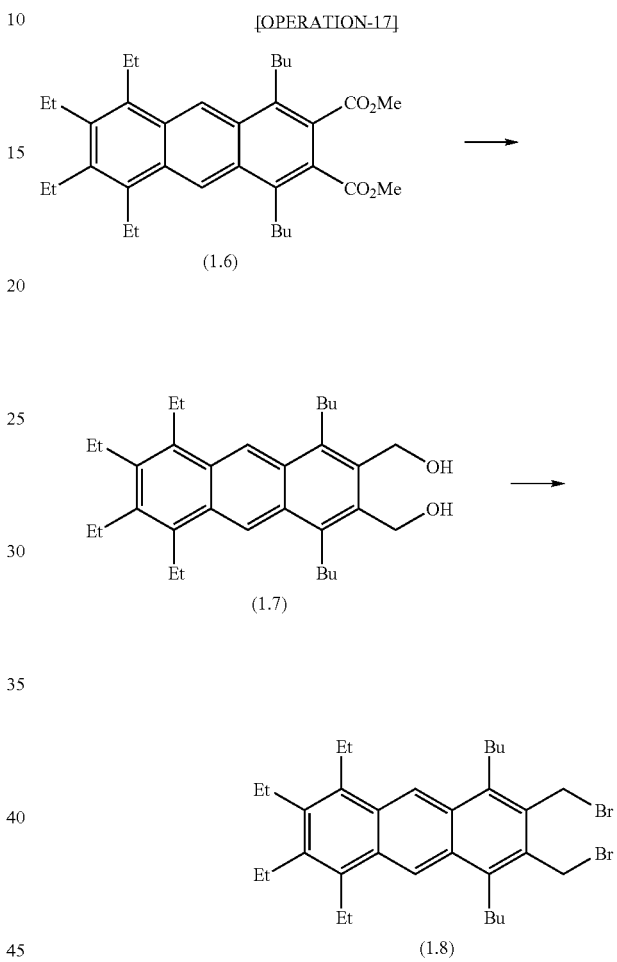

(1.6) → (1.7) → (1.8)

Next, 0.23 ml of 1-hexyne was added to 50 ml of THF. In the state in which a resultant solution was cooled at −78° C., 1.3 ml of n-BuLi hexane solution (1.6 mol/lit.) was added to the resultant solution and stirred at room temperature for one hour. After that, in the state in which a reaction solution was cooled at −78° C., 0.25 ml of DMPU and 0.20 g of dibromo material [compound (1.8)] dissolved into the THF were added to the resultant solution and stirred at room temperature for three hours. Next, 3N hydrochloric acid was added to the resultant solution and then reaction was ended Next, the resultant solution was extracted three times by 100 ml of hexane, sequentially rinsed with saturated sodium hydrogencarbonate and saturated brine and then dried by using magnesium sulfate. Subsequently, the solvent was removed from the resultant solution by using the evaporator and refined by the column chromatography (developing solvent: ethyl acetate/hexane=1/50) and thereby 0.17 g of a compound (1.9) could be obtained (yield: 85%).

[OPERATION-18]

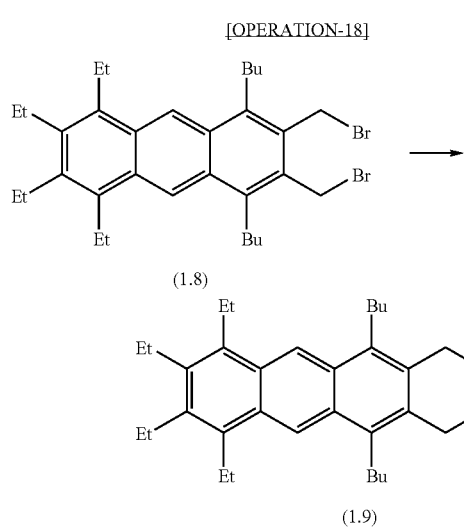

After that, after 0.085 g of Cp$_2$ZrCl$_2$ was dissolved into 5.0 ml of THF and cooled at −78° C., 0.37 ml of n-BuLi hexane solution (1.6 mol/lit.) was added to the resultant solution and the resultant solution was stirred at −78° C. for one hour. Next, 0.17 g of compound (1.9) in the state in which it was dissolved into the THE was added to the resultant solution and stirred at room temperature for three hours. Thereafter, 0.058 g of copper (I) chloride was added to the resultant solution and the resultant solution was cooled at 0° C. After that, 0.11 ml of DMAD was added to the resultant solution and stirred at room temperature for three hours. Then, 3N hydrochloric acid was added to the resultant solution and then reaction was ended. Next, the resultant solution was extracted three times by 20 ml of chloroform, sequentially rinsed with saturated sodium hydrogencarbonate and saturated brine and then dried by using magnesium sulfate. Subsequently, the solvent was removed from the resultant solution by using the evaporator and refined by the column chromatography (developing solvent: chloroform) and thereby 0.12 g of a compound (1.10) could be obtained as a solid material (isolated yield: 57%).

[OPERATION-19]

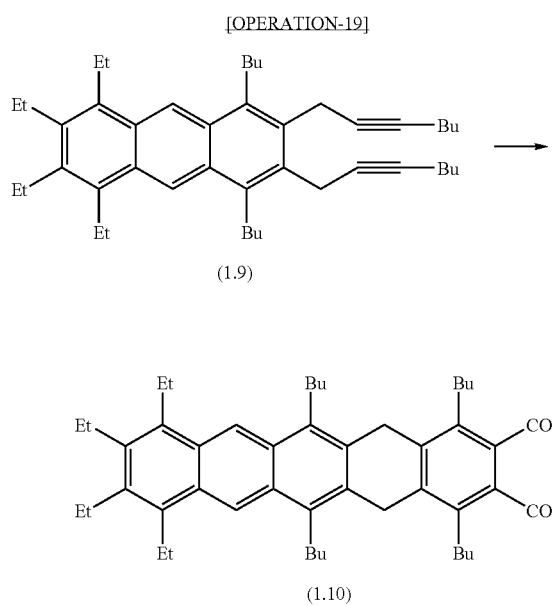

After that, in the inert gas atmosphere, 2.0 g of compound (1.10) and 0.68 g (equivalent weight is 1.1) of DDQ were dissolved into 100 ml of toluene and refluxed for 24 hours. Next, after the toluene of the solvent was decreased to 20 ml by distillation under reduced-pressure and thereby the resultant solution was changed into a saturated solution, 500 ml of methanol was added to the resultant solution and thereby precipitate was produced. Then, after the precipitate was filtered, the resultant product was dried and thereby 1.1 g of the pentacene derivative [compound (1.11)] of the inventive example 1 could be obtained (yield: 54%).

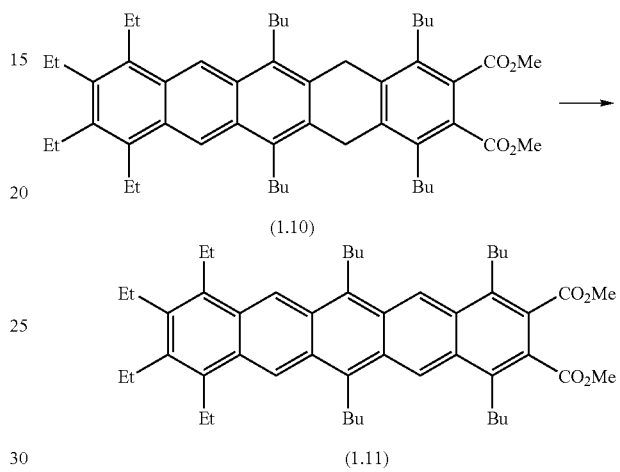

Example 2

Example 2 is a modified example of example 1. A chemical formula of an organic semiconductor material of example 2 is shown as follows.

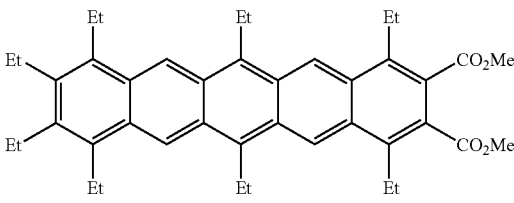

The organic semiconductor material of example 2 is made of a polyacene derivative shown by the above-described general formula (1). In the general formula (1), $R_1$, $R_2$, $R_3$, $R_4$, $R_5$, $R_6$, $R_{-7}$, $R_8$, $R_9$ and $R_{10}$ are respectively substituents which will follow. That is, the organic semiconductor material of example 2 is 2,3-bis methoxycarbonyl-1,4,6,8,9,10,11 13-octaethyl pentacene.

$R_1$: aliphatic hydrocarbon group (concretely, ethyl group)
$R_2$: carbonyl group (concretely, methoxycarbonyl group)
$R_3$: carbonyl group (concretely, methoxycarbonyl group)
$R_4$: aliphatic hydrocarbon group (concretely, ethyl group)
$R_5$: aliphatic hydrocarbon group (concretely, ethyl group)
$R_6$: aliphatic hydrocarbon group (concretely, ethyl group)
$R_7$: aliphatic hydrocarbon group (concretely, ethyl group)
$R_8$: aliphatic hydrocarbon group (concretely, ethyl group)
$R_9$: aliphatic hydrocarbon group (concretely, ethyl group)
$R_{10}$: aliphatic hydrocarbon group (concretely, ethyl group)

Alternatively, the organic semiconductor material according to example 2 is made of a polyacene derivative shown by the above-described general formula (2). $R_1$, $R_2$, $R_3$, $R_4$, $R_5$, $R_6$, $R_7$ and $R_8$ in the general formula (2) are the following substituents, respectively. Also in the inventive example 2, an equality of n=4 is satisfied.

$R_1$: aliphatic hydrocarbon group (concretely, ethyl group)

$R_2$: carbonyl group (concretely, methoxycarbonyl group)

$R_3$: carbonyl group (concretely, methoxycarbonyl group)

$R_4$: aliphatic hydrocarbon group (concretely, ethyl group)

$R_{51}$: hydrogen atom $R_{52}$: aliphatic hydrocarbon group (concretely, ethyl group)

$R_{53}$: hydrogen atom $R_{54}$: aliphatic hydrocarbon group (concretely, ethyl group)

$R_6$: aliphatic hydrocarbon group (concretely, ethyl group)

$R_7$: aliphatic hydrocarbon group (concretely, ethyl group)

$R_{81}$: aliphatic hydrocarbon group (concretely, ethyl group)

$R_{82}$: hydrogen atom $R_{83}$: aliphatic hydrocarbon group (concretely, ethyl group)

$R_{84}$: hydrogen atom

Operations of a test product (see a schematic fragmentary cross-sectional view of FIG. 3) of an organic field-effect transistor having a channel forming region formed based on the coating process such as a spin coating method using the chloroform solution (concentration: 5 g/lit.) of the organic semiconductor material of example 2 at room temperature were confirmed. As a result, gate modulation could be confirmed and it could be confirmed that the organic semiconductor thin film has played a role of the channel forming region. $1.5 \times 10^5$ $cm^2 \cdot V^{-1}$ $second^{-1}$ was obtained as mobility in the saturated region at that time depending on conditions of the spin coating and the like.

A method of synthesizing polyacene derivatives constructing the organic semiconductor material of the inventive example 2 will be described below.

[Operation-20]

First, [OPERATION-10] to [OPERATION-12] are executed.

[Operation-21]

Next, 7.5 g of 1-butyne was dissolved into 300 ml of THF. In the state in which a resultant solution was cooled at −78° C., 88 ml of n-BuLi hexane solution (1.6 mol/lit.) was added to the resultant solution and stirred at room temperature for one hour. After that, in the state in which a reaction solution was cooled at −78° C., 17 ml of DMPU and 8.7 g of dibromo material [compound (1.3)] dissolved into the THF were added to the resultant solution and stirred at room temperature for five hours. Next, 3N hydrochloric acid was added to the resultant solution and then reaction was ended. Next, the resultant solution was extracted three times by 100 ml of hexane, sequentially rinsed with saturated sodium hydrogencarbonate and saturated brine and then dried by using magnesium sulfate. Subsequently, the solvent was removed from the resultant solution by using the evaporator and refined by a recrystallization method and thereby 5.9 g of a compound (2.4) could be obtained (yield: 79%)

[OPERATION-22]

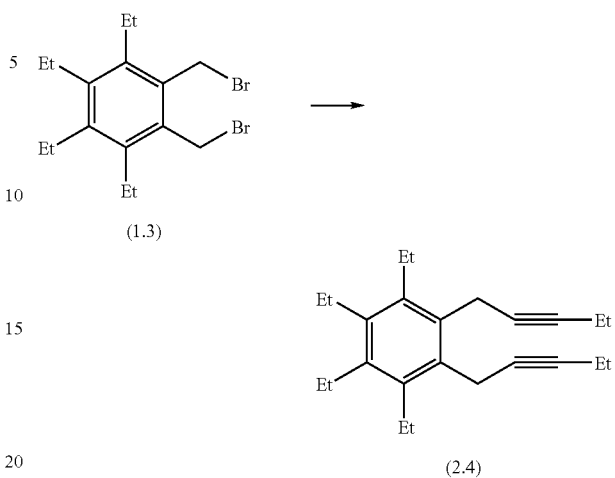

After that, after 5.4 g of $Cp_2ZrCl_2$ was dissolved into 100 ml of THF and cooled at −78° C., 24 ml of n-BuLi hexane solution (1.6 mol/lit.) was added to the resultant solution and the resultant solution was stirred at −78° C. for one hour. Next, 5.9 g of compound (2.4) in the state in which it was dissolved into the THF was added to the resultant solution and stirred at room temperature for three hours. Thereafter, 3.6 g of copper (I) chloride was added to the resultant solution and the resultant solution was cooled at 0° C. After that, 7.6 ml of DMAD was added to the resultant solution and stirred at room temperature for three hours. Then, 3N hydrochloric acid was added to the resultant solution and then reaction was ended. Next, the resultant solution was extracted three times by 200 ml of hexane, sequentially rinsed with saturated sodium hydrogencarbonate and saturated brine and then dried by using magnesium sulfate. Subsequently, the solvent was removed from the resultant solution by using the evaporator and refined by the column chromatography (developing solvent: ethyl acetate/hexane=1/5) and thereby 8.3 g of a compound (2.5) could be obtained as a solid material (isolated yield: 95%)

[OPERATION-23]

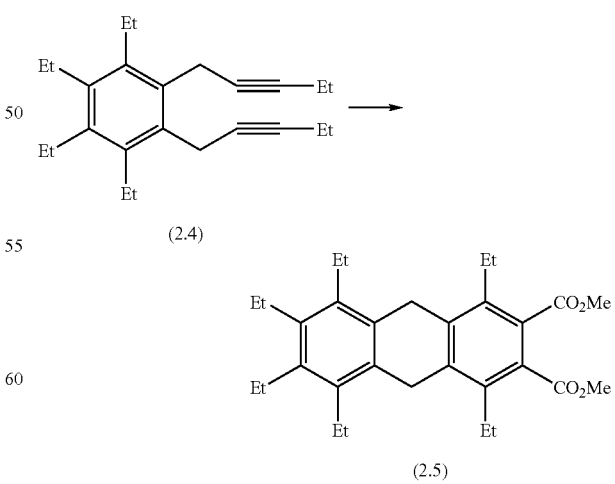

Next, 8.3 g of compound (2.5) and 4.1 g of DDQ were dissolved into 100 ml of toluene and refluxed for two hours.

After that, the resultant solution was filtered and the filtered solution was distillated under reduced-pressure by the evaporator. The resultant solid was dissolved into 10 ml of chloroform and 500 ml of methanol was added to the resultant solution and thereby a precipitate was obtained. Then, the precipitate was filtered and collected by a funnel (manufactured by KIRIYAMA GLASS WORKS CO., LTD., under the trade name of "KIRIYAMA ROHTO"), dried under reduced-pressure and thereby 5.2 g of compound (2.6) could be obtained as a solid material (isolated yield: 620).

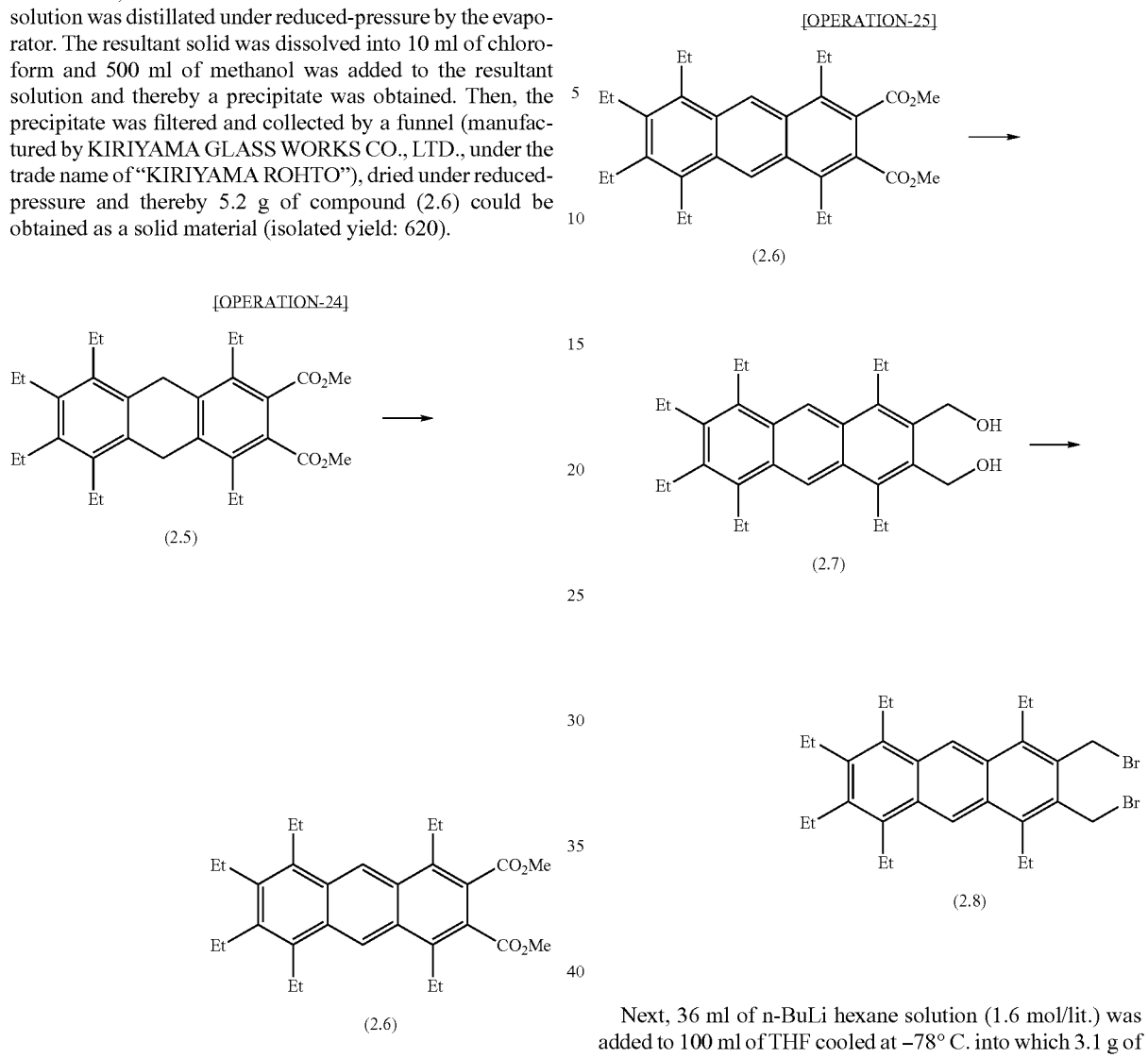

Next, 0.85 g of LiAlH$_4$ was added to 150 ml of THF cooled at 0° C. and 5.2 g of a compound (2.6) was added to this solution at 0° C. Then, after the resultant solution was stirred at room temperature for three hours, water was added to this resultant solution and reaction was ended. Then, 2N sulfuric acid was added to the resultant solution so that the resultant solution may become slightly acid. This solution was extracted three times by using 150 ml of diethyl ether, rinsed with the saturated brine and then dried by using magnesium sulfate. Then, after the solvent was distillated under reduced pressure by the evaporator, 80 ml of chloroform was added to the resultant solution into which 1.3 ml of PBr$_3$ was added. Then, after the resultant solution was stirred at room temperature for 12 hours, water was added to the resultant solution and reaction was ended. Then, the resultant solution was extracted three times by using 100 ml of ethyl acetate, sequentially rinsed with saturated sodium hydrogencarbonate and saturated brine and dried by using magnesium sulfate. Thereafter, after the solvent was removed from the resultant solution by the evaporator, the resultant solution was recrystallized by hexane and thereby 5.1 g of a compound (2.8) could be obtained as a white solid (yield: 86%).

Next, 36 ml of n-BuLi hexane solution (1.6 mol/lit.) was added to 100 ml of THF cooled at −78° C. into which 3.1 g of 1-butyne was added. After 1-butyne was completely added to the resultant solution, the reaction solution was returned to room temperature and stirred for one hour. Thereafter, the reaction solution was cooled to −78° C. into which 7.2 ml of DMPU was added. Then, a solution in which 5.1 g of compound (2.8) was dissolved into 40 ml of THF was added to the resultant solution and the resultant solution was returned to room temperature and stirred for six hours. Then, after the reaction was ended, 50 ml of 3N hydrochloric acid was added to the resultant solution and the reaction was ended. Then, the resultant solution was extracted by 250 ml of ethyl acetate, rinsed with saturated sodium hydrogencarbonate and saturated brine and dried by using magnesium sulfate. Thereafter, after the magnesium sulfate and the organic solvent were separated by filtering and the organic solvent was distillated under reduced-pressure by the evaporator. Then, after the resultant solid was dissolved into chloroform to produce a saturated solution, methanol of a quantity 50 times as large as the chloroform was added to the saturated solution and thereby a precipitate was produced. The resultant precipitate was filtered, separated and dried at reduced-pressure and thereby 3.6 g of a target compound (2.9) could be obtained (yield: 78%).

[OPERATION-26]

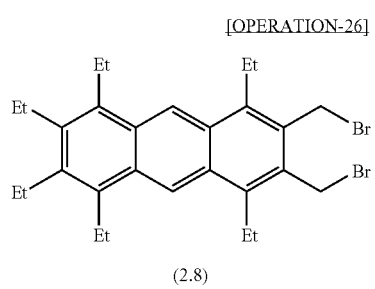

(2.8)

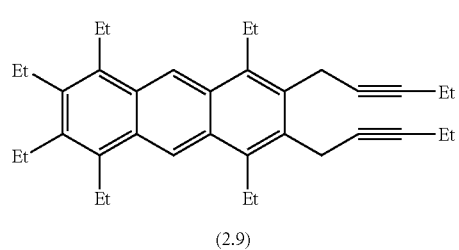

(2.9)

Subsequently, 2.0 g of $Cp_2ZrCl_2$ was dissolved into 100 ml of THF and cooled to −78° C. After that, 8.9 ml of n-BuLi hexane solution (1.6 mol/lit) was added to the resultant solution and stirred at −78° C. for one hour. 3.3 g of compound (2.9) was added to the resultant solution in the state in which the above compound was dissolved into 50 ml of THF and stirred for three hours. Thereafter, 1.4 g of copper (I) chloride was added to the resultant solution and cooled at 0° C. Next, 2.7 ml of DMAD was added to the resultant solution and stirred at room temperature for six hours. Then, 50 ml of 3N hydrochloric acid was added to the resultant solution and the reaction was ended. Then, the resultant solution was extracted three times by using 200 ml of ethyl acetate, sequentially rinsed with saturated sodium hydrogencarbonate and saturated brine and dried by using magnesium sulfate. Thereafter, after the magnesium sulfate and the organic solvent were separated by filtering and the organic solvent was distilled under reduced-pressure by the evaporator. Then, after the resultant solid was dissolved into chloroform to produce a saturated solution, methanol of a quantity 50 times as large as the chloroform was added to the saturated solution and thereby a precipitate was produced. The resultant precipitate was filtered, separated and dried at reduced-pressure and thereby 2.4 g of a compound (2.10) could be obtained (yield: 35%).

[OPERATION-27]

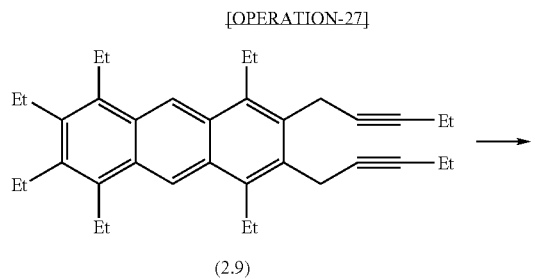

(2.9)

-continued

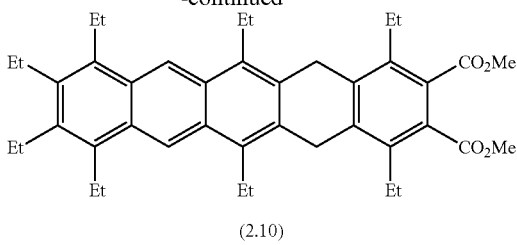

(2.10)

After that, 2.4 g of compound (2.10) and 0.87 g of DDQ were dissolved into 80 ml of toluene and refluxed for 24 hours. Then, toluene of solvent was distilled under reduced-pressure. Then, the resultant solid was dissolved into 5.0 ml of chloroform to which 150 ml of methanol was added and thereby a precipitate of a pentacene derivative [compound (2.11)] could be obtained. Next, the resultant precipitate was recollected by filtering, dried under reduced-pressure and thereby 1.3 g of pentacene derivative [compound (2.11)] could be obtained (yield: 55%).

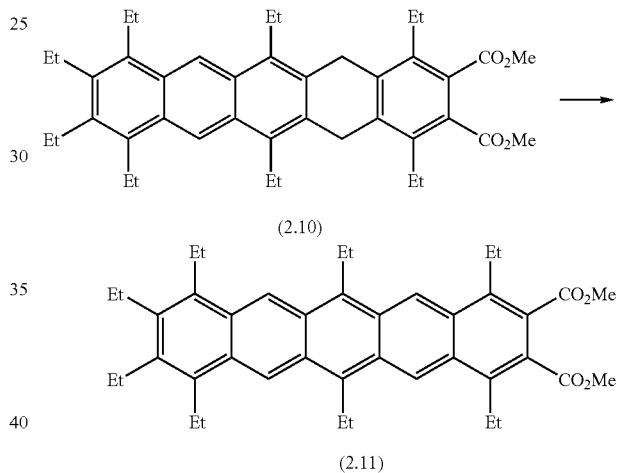

Example 3

Example 3 also is a modified example of example 1. A chemical formula of an organic semiconductor material according to example 3 is shown as follows.

The organic semiconductor material of example 3 is made of a polyacene derivative shown by the above-described general formula (1). In the general formula (1), $R_1$, $R_2$, $R_3$, $R_4$, $R_5$, $R_6$, $R_7$, $R_8$, $R_9$ and $R_{10}$ are respectively substituents which will follow. That is, the organic semiconductor material of the inventive example 3 is 2,3-bis methoxycarbonyl-8,9,10,11-tetra ethyl-1,4,6,13-tetra propyl pentacene.

R$_1$: aliphatic hydrocarbon group (concretely, propyl group)
R$_2$: carbonyl group (concretely, methoxycarbonyl group)
R$_3$: carbonyl group (concretely, methoxycarbonyl group)
R$_4$: aliphatic hydrocarbon group (concretely, propyl group)
R$_5$: aliphatic hydrocarbon group (concretely, propyl group)
R$_6$: aliphatic hydrocarbon group (concretely, ethyl group)
R$_7$: aliphatic hydrocarbon group (concretely, ethyl group)
R$_8$: aliphatic hydrocarbon group (concretely, ethyl group)
R$_9$: aliphatic hydrocarbon group (concretely, ethyl group)
R$_{10}$: aliphatic hydrocarbon group (concretely, propyl group)

Alternatively, the organic semiconductor material according to example 3 is made of a polyacene derivative shown by the above-described general formula (2). R$_1$, R$_2$, R$_3$, R$_4$, R$_5$, R$_6$, R$_7$ and R$_8$ in the general formula (2) are the following substituents, respectively. Also in the inventive example 3, an equality of n=4 is satisfied.

R$_1$: aliphatic hydrocarbon group (concretely, propyl group)
R$_2$: carbonyl group (concretely, methoxycarbonyl group)
R$_3$: carbonyl group (concretely, methoxycarbonyl group)
R$_4$: aliphatic hydrocarbon group (concretely, propyl group)
R$_{51}$: hydrogen atom
R$_{52}$: aliphatic hydrocarbon group (concretely, propyl group)
R$_{53}$: hydrogen atom
R$_{54}$: aliphatic hydrocarbon group (concretely, ethyl group)
R$_6$: aliphatic hydrocarbon group (concretely, ethyl group)
R$_7$: aliphatic hydrocarbon group (concretely, ethyl group)
R$_{81}$: aliphatic hydrocarbon group (concretely, ethyl group)
R$_{82}$: hydrogen atom R$_{83}$: aliphatic hydrocarbon group (concretely, propyl group)
R$_{84}$: hydrogen atom Operations of a test product (see a schematic fragmentary cross-sectional view of FIG. 3) of an organic field-effect transistor having a channel forming region formed based on the coating process such as a spin coating method using the chloroform solution (concentration: 5 g/lit.) of the organic semiconductor material of example 3 at room temperature were confirmed. As a result, gate modulation could be confirmed and it could be confirmed that the organic semiconductor thin film has played a role of the channel forming region. 9.0×10$^{-6}$ cm$^2$ V$^{-1}$·second$^{-1}$ was obtained as mobility in the saturated region at that time depending on conditions of the spin coating and the like.

A method of synthesizing polyacene derivatives constructing the organic semiconductor material of example 3 will be described below.

[Operation-30]
First, [OPERATION-10] to [OPERATION-12] in example 1 are executed.

[Operation-31]
First, 5.9 ml of 1-pentyne was added to 50 ml of THF and cooled at −78° C. In this state, 38 ml of n-BuLi hexane solution (1.6 mol/lit.) was added to the resultant solution and stirred at room temperature for one hour. Thereafter, in the state in which a reaction solution was cooled at −78° C., 7.5 ml of DMPU and 3.8 g of a dibromo material [compound (1.3)] dissolved into the THF were added to the reaction solution and stirred at room temperature for five hours. Then, 3N hydrochloric acid was added to the resultant solution and the reaction was ended. The resultant product was extracted three times by using 100 ml of hexane solution, sequentially rinsed with saturated sodium hydrogencarbonate and saturated brine and then dried by using magnesium sulfate. After that, a solvent is removed from the resultant product by the evaporator and refined by the column chromatography (developing solvent): ethyl acetate/hexane 1/50) and thereby 3.1 g of the compound (3.4) could be obtained (yield: 88%).

[OPERATION-32]

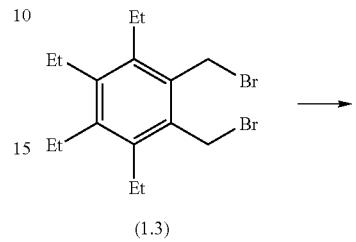

(1.3)

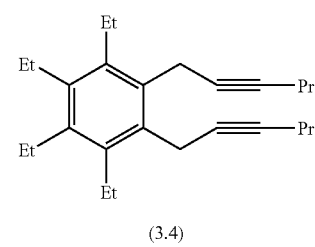

(3.4)

After that, 2.6 g of Cp$_2$ZrCl$_2$ was dissolved into 50 ml of the THF and cooled to −78° C. After that, 11 ml of n-BuLi hexane solution (1.6 mol/lit.) was added to the resultant solution and stirred at −78° C. for one hour. 3.1 g of a compound (3.4) was added to the resultant solution in the state in which the above compound was dissolved into the THF and stirred at room temperature for three hours. Thereafter, 1.8 g of copper (I) chloride was added to the resultant solution and cooled at 0° C. Then, 32 ml of the DMAD was added to the resultant solution and stirred at room temperature for three hours. After that, 3N hydrochloric acid was added to the resultant solution and the reaction was ended. Then, the resultant solution was extracted three times by using 100 ml of hexane, sequentially rinsed with saturated sodium hydrogencarbonate and saturated brine and dried by using magnesium sulfate. After that, a solvent is removed from the resultant product by the evaporator and refined by the column chromatography (developing solvent): ethyl acetate/hexane=1/9) and thereby 2.9 g of a compound (3.5) could be obtained as a solid material (isolated yield: 68%)

[OPERATION-33]

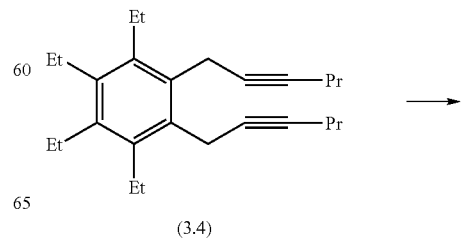

(3.4)

-continued

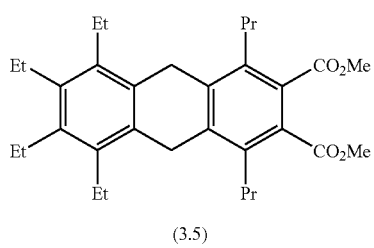

(3.5)

Next, 2.9 g of compound (0.5) and 1.6 g of DDQ were dissolved into 60 ml of toluene and refluxed for three hours. After that, the resultant solution was filtered and the filtered solution was distillated under reduced-pressure by the evaporator. The resultant solid was refined by the column chromatography (developing solvent: ethyl acetate/hexane=1/9) and thereby 2.6 g of compound (3.6) could be obtained as a solid material (isolated yield: 89%).

[OPERATION-34]

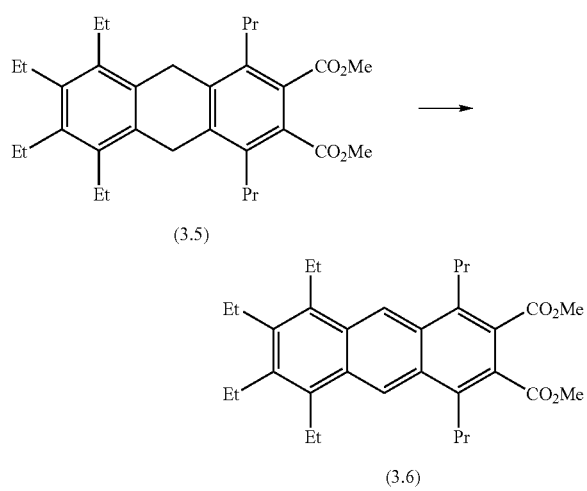

Next, 0.41 g of LiAlH$_4$ was added to 100 ml of THF cooled at 0° C. and 2.6 g of a compound (3.6) was added to this solution at 0° C. Then, after the resultant solution was stirred at room temperature for three hours, water was added to this resultant solution and the reaction was ended. Then, 2N sulfuric acid was added to the resultant solution so that the resultant solution may become slightly acid. This solution was extracted three times by using 100 ml of diethyl ether, rinsed with the saturated brine and then dried by using magnesium sulfate. Then, after the solvent was distillated by the evaporator, 40 ml of chloroform was added to the resultant solution into which 0.51 ml of PBr$_3$ was added. Then, after the resultant solution was stirred at room temperature for 12 hours, water was added to the resultant solution and the reaction was ended. Then, the resultant solution was extracted three times by using 100 ml of ethyl acetate, sequentially rinsed with saturated sodium hydrogencarbonate and saturated brine and dried by using magnesium sulfate. Thereafter, after the solvent was removed from the resultant solution by the evaporator, the resultant solution was recrystallized by hexane and thereby 2.4 g of a compound (3.8) could be obtained as a white solid (yield: 81%).

[OPERATION-35]

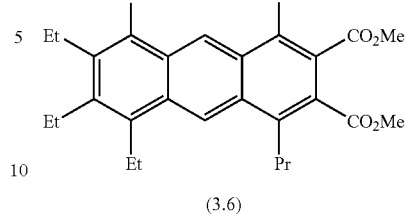

(3.6)

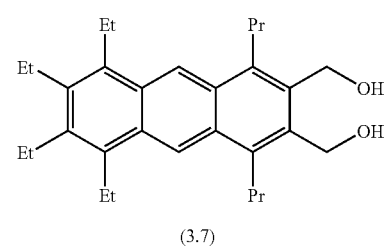

(3.7)

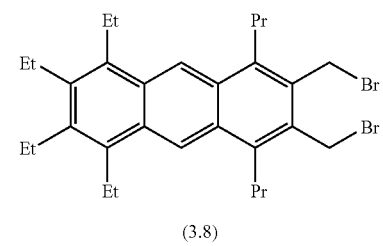

(3.8)

Next, 2.6 ml of 1-pentyne was added to 100 ml of THF and cooled at −78° C. In this state, 17 ml of n-BuLi hexane solution (1.6 mol/lit.) was added to the resultant solution, the resultant solution was returned to room temperature and stirred for one hour. Thereafter, the reaction solution was cooled to −78° C. into which 3.3 ml of DMPU was added. Then, a solution in which 2.4 g of a compound (3.8) was dissolved into the THF was added to the resultant solution and the resultant solution was returned to room temperature and stirred for three hours. Then, 3N hydrochloric acid was added to the resultant solution and the reaction was ended. Then, the resultant solution was extracted by 150 ml of hexane, rinsed with saturated sodium hydrogencarbonate and saturated brine and dried by using magnesium sulfate. Thereafter, the solvent was removed from the resultant solution by the evaporator and the organic solvent was distillated under reduced-pressure by the evaporator. Then, after the resultant solid was dissolved into chloroform to produce a saturated solution, methanol of a quantity 50 times as large as the chloroform was added to the saturated solution and thereby a precipitate was produced. The resultant precipitate was separated by filtering and dried at reduced-pressure and thereby 2.3 g of a target compound (3.9) could be obtained (yield: 99%).

[OPERATION-36]

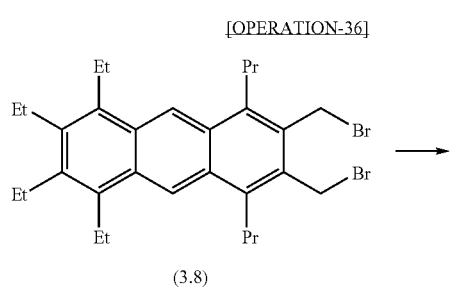

(3.8)

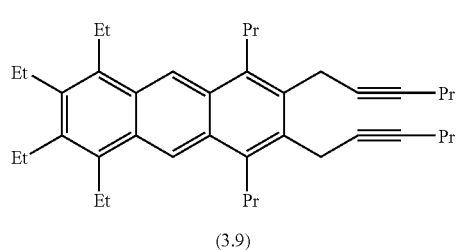

(3.9)

Subsequently, 1.9 g of $Cp_2ZrCl_2$ was dissolved into 100 ml of THF and cooled to −78° C. After that, 8.4 ml of n-BuLi hexane solution (1.6 mol/lit.) was added to the resultant solution and stirred at −78° C. for one hour. 3.5 g of compound (3.9) was added to the resultant solution in the state in which the above compound was dissolved into 50 ml of THF and stirred at room temperature for three hours. Thereafter, 1.3 g of copper (I) chloride was added to the resultant solution and cooled at 0° C. Next, 2.4 ml of DMAD was added to the resultant solution and stirred at room temperature for six hours. Then, 50 ml of 3N hydrochloric acid was added to the resultant solution and the reaction was ended. Then, the resultant solution was extracted by using 200 ml of ethyl acetate, sequentially rinsed with saturated sodium hydrogencarbonate and saturated brine and dried by using magnesium sulfate. Thereafter, the magnesium sulfate and the organic solvent were separated by filtering and the organic solvent was distillated under reduced-pressure by the evaporator. Then, after the resultant solid was dissolved into chloroform to produce a saturated solution, methanol of a quantity 50 times as large as the chloroform was added to the saturated solution and thereby a precipitate was produced. The resultant precipitate was separated by filtering and dried at reduced-pressure and thereby 3.74 g of a compound (3.10) could be obtained (yield: 84%).

[OPERATION-37]

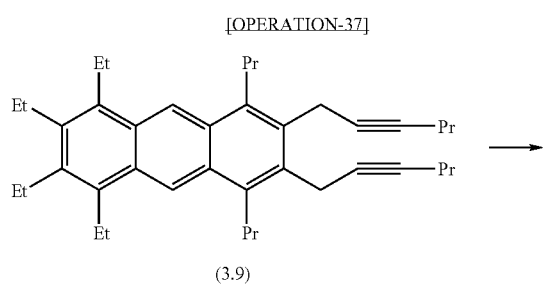

(3.9)

-continued

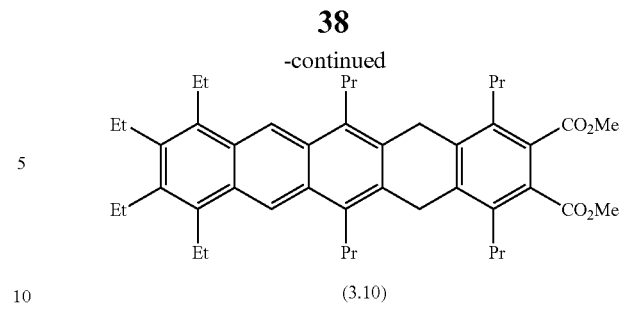

(3.10)

After that, 0.60 g of compound (3.10) and 0.22 g of DDQ (1.1 equivalent weight) were dissolved into 12 ml of toluene and refluxed for 24 hours. Then, toluene used as the solvent was decreased to 6.0 ml by distillation under reduced-pressure. Then, 120 ml of methanol was added to the resultant solution and thereby a precipitate was produced. After that, the resultant precipitate was filtered and rinsed with methanol and dried and thereby 0.21 g of a pentacene derivative (3.11) could be obtained (yield: 34%).

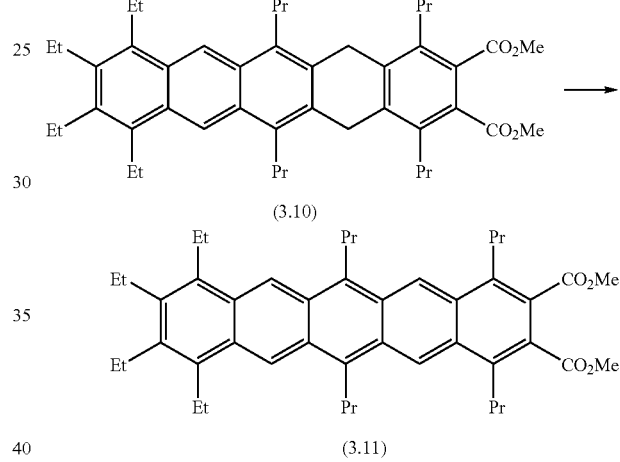

(3.10)

(3.11)

The X-ray crystal structure analysis was effected on the polyacene derivative of example 1, the polyacene derivative of example 2 and the polyacene derivative of example 3. As a result, it became clear that the crystal structure was changed from the herringbone structure to the stack structure as the alkyl chains at the positions of 1, 4, 6 and 13 are extended.

Example 4

Example 4 also is a modified example of example 1. A chemical formula of an organic semiconductor material of example 4 is shown as follows.

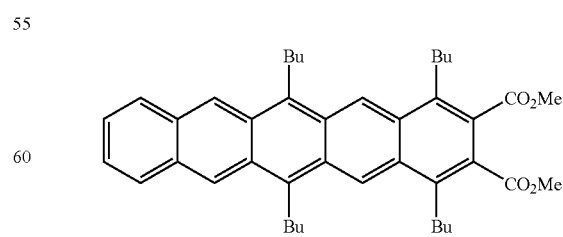

The organic semiconductor material according to example 4 is made of a polyacene derivative shown by the above-described general formula (1). In the general formula (1), $R_1$, $R_2$, $R_3$, $R_4$, $R_5$, $R_6$, $R_7$, $R_6$, $R_9$ and $R_{10}$ are respectively substituents which will follow. That is, the organic semiconductor material of the inventive example 4 is 2,3-bis methoxycarbonyl-1,4,6,13-tetrabuyl pentacene.

$R_1$: aliphatic hydrocarbon group (concretely, butyl group)
$R_2$: carbonyl group (concretely, methoxycarbonyl group)
$R_3$: carbonyl group (concretely, methoxycarbonyl group)
$R_4$: aliphatic hydrocarbon group (concretely, butyl group)
$R_5$: aliphatic hydrocarbon group (concretely, butyl group)
$R_6$: hydrogen atom
$R_7$: hydrogen atom
$R_8$: R8: hydrogen atom
$R_9$: R9: hydrogen atom
$R_{10}$: aliphatic hydrocarbon group (concretely, butyl group)

Alternatively, the organic semiconductor material according to example 4 is made of a polyacene derivative shown by the above-described general formula (2). $R_1$, $R_2$, $R_3$, $R_4$, $R_5$, $R_6$, $R_7$ and $R_8$ in the general formula (2) are the following substituents, respectively. Also in example 4, an equality of n=4 is satisfied.

$R_1$: aliphatic hydrocarbon group (concretely, butyl group)
$R_2$: carbonyl group (concretely, methoxycarbonyl group)
$R_3$: carbonyl group (concretely, methoxycarbonyl group)
$R_4$: aliphatic hydrocarbon group (concretely, butyl group)
$R_{51}$: hydrogen atom
$R_{52}$: aliphatic hydrocarbon group (concretely, butyl group)
$R_{53}$: hydrogen atom
$R_{54}$: hydrogen atom
$R_6$: hydrogen atom
$R_7$: hydrogen atom
$R_{81}$: hydrogen atom
$R_{82}$: hydrogen atom
$R_{83}$: aliphatic hydrocarbon group (concretely, butyl group)
$R_{84}$: hydrogen atom Operations of a test product (see a schematic fragmentary cross-sectional view of FIG. 3) of an organic field-effect transistor having a channel forming region formed based on the coating process such as a spin coating method using the chloroform solution (concentration: 5 g/lit.) of the organic semiconductor material of example 4 at room temperature were confirmed. As a result, gate modulation could be confirmed and it could be confirmed that the organic semiconductor thin film has played a role of the channel forming region. $9.0 \times 10^{-5}$ cm$^2$ V$^{-1}$ second$^{-1}$ was obtained as mobility in the saturated region at that time depending on conditions of the spin coating and the like.

Also, experiments were carried out in which the polyacene derivative of example 1, the polyacene derivative of example 2, the polyacene derivative of example 3 and the polyacene derivative of example 4 were respectively dissolved into hexane solution at room temperature. As a result, while the polyacene derivative of example 2 in which 80% of the substituents is the ethyl group was hardly dissolved into the hexane solution, the polyacene derivatives of examples 1 and 3 were dissolved into the hexane solution and became deep blue solutions. Also, the polyacene derivative of the inventive example 4 of which number of the substituents is less than that of the polyacene derivative of example 2 by four was dissolved into the hexane solution. From the above-mentioned results, the length of the substituent is important rather than the number of the substituent and it became clear that the substituent having the length longer than that of the propyl group is more effective for improving solubility of solvent.

Example 5

Example 5 also is a modified example of example 1. A chemical formula of an organic semiconductor material of example 5 is shown as follows.

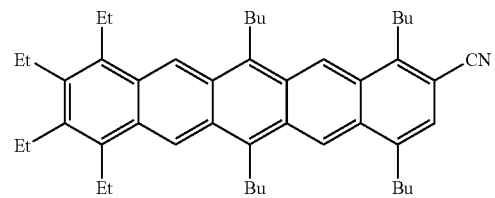

The organic semiconductor material according to example 5 is made of a polyacene derivative shown by the above-described general formula (1). In the general formula (1), $R_1$, $R_2$, $R_3$, $R_4$, $R_5$, $R_6$, $R_7$, $R_8$, $R_9$ and $R_{10}$ are respectively substituents which will follow. That is, the organic semiconductor material of example 5 is 2-cyano-1,4,6,13-tetrabutyl-8,9,10,11-tetraethyl pentacene.

$R_1$: aliphatic hydrocarbon group (concretely, butyl group)
$R_2$: cyano group
$R_3$: hydrogen atom
$R_4$: aliphatic hydrocarbon group (concretely, butyl group)
$R_5$: aliphatic hydrocarbon group (concretely, butyl group)
$R_6$: aliphatic hydrocarbon group (concretely, ethyl group)
$R_7$: aliphatic hydrocarbon group (concretely, ethyl group)
$R_8$: aliphatic hydrocarbon group (concretely, ethyl group)
$R_9$: aliphatic hydrocarbon group (concretely, ethyl group)
$R_{10}$: aliphatic hydrocarbon group (concretely, ethyl group)

Alternatively, the organic semiconductor material according to the inventive example 5 is made of a polyacene derivative shown by the above-described general formula (2). $R_1$, $R_2$, $R_3$, $R_4$, $R_5$, $R_6$, $R_7$ and $R_8$ in the general formula (2) are the following substituents, respectively. Also in the inventive example 5, an equality of n=4 is satisfied.

$R_1$: aliphatic hydrocarbon group (concretely, butyl group)
$R_2$: cyano group
$R_3$: hydrogen atom
$R_4$: aliphatic hydrocarbon group (concretely, butyl group)
$R_{51}$: hydrogen atom
$R_{52}$: aliphatic hydrocarbon group (concretely, butyl group)
$R_{53}$: hydrogen atom
$R_{54}$: aliphatic hydrocarbon group (concretely, ethyl group)
$R_6$: aliphatic hydrocarbon group (concretely, ethyl group)
$R_7$: aliphatic hydrocarbon group (concretely, ethyl group)
$R_{81}$: aliphatic hydrocarbon group (concretely, ethyl group)
$R_{82}$: hydrogen atom
$R_{83}$: aliphatic hydrocarbon group (concretely, butyl group)
$R_{84}$: hydrogen atom Operations of a test product (see a schematic fragmentary cross-sectional view of FIG. 3) of an organic field-effect transistor having a channel forming region formed based on the coating process such as a spin coating method using the chloroform solution (concentration: 5 g/lit.) of the organic semiconductor material of example 5 at room temperature were confirmed. As a result, gate modulation could be confirmed and it could be confirmed that the organic semiconductor thin film has played a role of the channel forming region. $1.7 \times 10^{-3}$ cm$^2$ V$^{-1}$ second$^{-1}$ was obtained as mobility in the saturated region at that time depending on conditions of the spin coating and the like.

Example 6

Example 6 relates to the organic semiconductor materials, the organic semiconductor thin films and the organic semiconductor devices according to the second and third aspects of the present invention. A chemical formula of the organic semiconductor material according to example 6 is shown as follows.

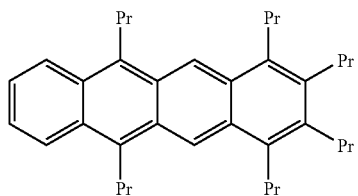

The organic semiconductor material according to example 6 is made of a polyacene derivative shown by the following general formula (3). In the general formula (3), $R_1$, $R_2$, $R_3$, $R_4$, $R_5$ and $R_6$ are respectively substituents propyl groups.

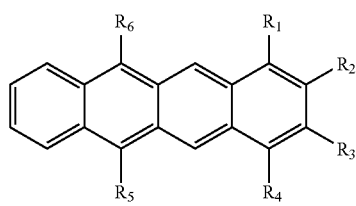

(3)

Alternatively, the organic semiconductor material according to example 6 is made of the polyacene derivative shown by the above-described general formula (2). $R_1$, $R_2$, $R_3$, $R_4$, $R_5$, $R_6$, $R_7$ and $R_8$ in the general formula (2) are respectively the following substituents. In example 6, an equality of n=3 is satisfied.

$R_1$: aliphatic hydrocarbon group (concretely, propyl group)

$R_2$: aliphatic hydrocarbon group (concretely, propyl group)

$R_3$: aliphatic hydrocarbon group (concretely, propyl group)

$R_4$: aliphatic hydrocarbon group (concretely, propyl group)

$R_{51}$: hydrogen carbon $R_{52}$: aliphatic hydrocarbon group (concretely, propyl group)

$R_{53}$: hydrogen carbon $R_6$: hydrogen carbon $R_7$: hydrogen carbon $R_{81}$: hydrogen carbon $R_{82}$: aliphatic hydrocarbon group (concretely, propyl group)

$R_{83}$: hydrogen carbon

Operations of a test product (see a schematic fragmentary cross-sectional view of FIG. 3) of an organic field-effect transistor having a channel forming region formed based on the coating process such as a spin coating method using a mesitylene solution (concentration: 5 g/lit.) of the organic semiconductor material of example 6 at room temperature were confirmed. As a result, gate modulation could be confirmed and it could be confirmed that the organic semiconductor thin film has played a role of the channel forming region. 0.01 cm$^2$ V$^{-1}$ second$^{-1}$ was obtained as mobility in the saturated region at that time depending on conditions of the spin coating and the like.

Example 7

Example 7 is a modified example of example 6. A chemical formula of the organic semiconductor material according to example 7 is shown as follows.

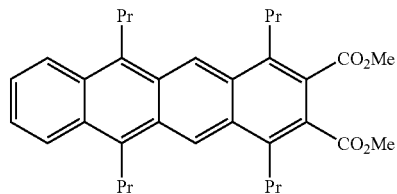

The organic semiconductor material according to example 7 is made of a polyacene derivative shown by the above-described general formula (3). $R_1$, $R_4$, $R_5$ and $R_6$ in the general formula (3) are respectively propyl groups and $R_2$ and $R_3$ are respectively methoxycarbonyl group.

Alternatively, the organic semiconductor material according to example 7 is made of the polyacene derivative shown by the above-described general formula (2). $R_1$, $R_2$, $R_3$, $R_4$, $R_5$, $R_6$, $R_7$ and $R_8$ in the general formula (2) are respectively the following substituents. Also in the inventive example 6, an equality of n=3 is satisfied.

$R_1$: aliphatic hydrocarbon group (concretely, propyl group)

$R_2$: carbonyl group (concretely, methoxycarbonyl group)

$R_3$: carbonyl group (concretely, methoxycarbonyl group)

$R_4$: aliphatic hydrocarbon group (concretely, propyl group)

$R_{51}$: hydrogen atom $R_{52}$: aliphatic hydrocarbon group (concretely, propyl group)

$R_{53}$: hydrogen atom $R_6$: hydrogen atom $R_7$: hydrogen atom $R_{81}$: hydrogen atom $R_{82}$: aliphatic hydrocarbon group (concretely, propyl group)

$R_{83}$: hydrogen atom

Operations of a test product (see a schematic fragmentary cross-sectional view of FIG. 3) of an organic field-effect transistor having a channel forming region formed based on the coating process such as a spin coating method using a toluene solution (concentration: 5 g/lit.) of the organic semiconductor material of example 7 at room temperature were confirmed. As a result, gate modulation could be confirmed and it could be confirmed that the organic semiconductor thin film has played a role of the channel forming region. 2.0×10$^{-5}$ cm$^2$ V$^{-1}$ second$^{-1}$ was obtained as mobility in the saturated region at that time depending on conditions of the spin coating and the like.

Example 8

The inventive example 8 also is a modified example of example 6. A chemical formula of the organic semiconductor material according to example 8 is shown as follows.

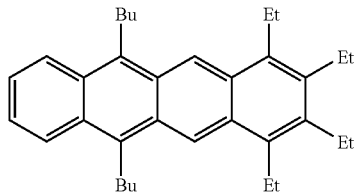

The organic semiconductor material according to example 8 is made of a polyacene derivative shown by the above-described general formula (3). $R_1$, $R_2$, $R_3$ and $R_4$ in the general formula (3) are respectively ethyl groups and $R_5$ and $R_6$ are respectively butyl groups.

Alternatively, the organic semiconductor material according to example 8 is made of the polyacene derivative shown by the above-described general formula (2). $R_1$, $R_2$, $R_3$, $R_4$, $R_5$, $R_6$, $R_7$ and $R_8$ in the general formula (2) are respectively the following substituents. Also in the 8, an equality of n=3 is satisfied.

$R_1$: aliphatic hydrocarbon group (concretely, ethyl group)
$R_2$: aliphatic hydrocarbon group (concretely, ethyl group)
$R_3$: aliphatic hydrocarbon group (concretely, ethyl group)
$R_4$: aliphatic hydrocarbon group (concretely, ethyl group)
$R_5$: hydrogen atom
$R_{52}$: aliphatic hydrocarbon group (concretely, butyl group)
$R_{53}$: hydrogen atom
$R_6$: hydrogen atom
$R_7$: hydrogen atom
$R_{81}$: hydrogen atom
$R_{82}$: aliphatic hydrocarbon group (concretely, butyl group)
$R_{83}$: hydrogen atom Operations of a test product (see a schematic fragmentary cross-sectional view of FIG. 3) of an organic field-effect transistor having a channel forming region formed based on the coating process such as a spin coating method using a mesitylene solution (concentration: 5 g/lit.) of the organic semiconductor material of example 8 at room temperature were confirmed. As a result, gate modulation could be confirmed and it could be confirmed that the organic semiconductor thin film has played a role of the channel forming region. $2.0 \times 10^5$ cm$^2$ V–1 second$^{-1}$ was obtained as mobility in the saturated region at that time depending on conditions of the spin coating and the like.

Example 9

Example 9 also is a modified example of example 6. A chemical formula of the organic semiconductor material according to example 9 is shown as follows.

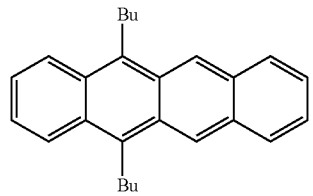

The organic semiconductor material according to example 9 is made of a polyacene derivative shown by the above-described general formula (3). $R_1$, $R_2$, $R_3$ and $R_4$ in the general formula (3) are respectively hydrogen atoms and $R_5$ and $R_6$ are respectively butyl groups.

Alternatively, the organic semiconductor material according to example 9 is made of the polyacene derivative shown by the above-described general formula (2). $R_1$, $R_2$, $R_3$, $R_4$, $R_5$, $R_6$, $R_7$ and $R_8$ in the general formula (2) are respectively the following substituents. Also in the inventive example 9, an equality of n=3 is satisfied.

$R_1$: hydrogen atom
$R_2$: hydrogen atom
$R_3$: hydrogen atom
$R_4$: hydrogen atom
$R_5$: hydrogen atom
$R_{52}$ aliphatic hydrocarbon group (concretely, butyl group)
$R_{53}$: hydrogen atom
$R_6$: hydrogen atom
$R_7$: hydrogen atom
$R_{81}$: hydrogen atom
$R_{82}$: aliphatic hydrocarbon group (concretely, butyl group)
$R_{83}$: hydrogen atom Operations of a test product (see a schematic fragmentary cross-sectional view of FIG. 3) of an organic field-effect transistor having a channel forming region formed based on the coating process such as a spin coating method using a chloroform solution (concentration: 5 g/lit.) of the organic semiconductor material of example 8 at room temperature were confirmed. As a result, gate modulation could be confirmed and it could be confirmed that the organic semiconductor thin film has played a role of the channel forming region. $2.0 \times 10$ cm$^2$V$^{-1}$ second$^{-1}$ was obtained as mobility in the saturated region at that time depending on conditions of the spin coating and the like.

Example 10

Example 10 also is a modified example of the inventive example 6. A chemical formula of the organic semiconductor material according to the inventive example 10 is shown as follows.

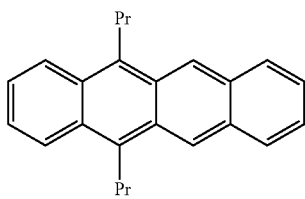

The organic semiconductor material according to example 10 is made of a polyacene derivative shown by the above-described general formula (3). $R_1$, $R_2$, $R_3$ and $R_4$ in the general formula (3) are respectively hydrogen atoms and $R_5$ and $R_6$ are respectively propyl group.

Alternatively, the organic semiconductor material according to example 10 is made of the polyacene derivative shown by the above-described general formula (2). $R_1$, $R_2$, $R_3$, $R_4$, $R_5$, $R_6$, $R_7$ and $R_8$ in the general formula (2) are respectively the following substituents. Also in example 10, an equality of n=3 is satisfied.

R1: hydrogen atom
R2: hydrogen atom
R3: hydrogen atom
R4: hydrogen atom
R51: hydrogen atom
R52: aliphatic hydrocarbon group (concretely, propyl group)
R53: hydrogen atom
R6: hydrogen atom
R7: hydrogen atom
R81: hydrogen atom
R82: aliphatic hydrocarbon group (concretely, propyl group)
R83: hydrogen atom Operations of a test product (see a schematic fragmentary cross-sectional view of FIG. 3) of an organic field-effect transistor having a channel forming region formed based on the coating process such as a spin coating method using a mesitylene solution (concentration: 5 g/lit.) of the organic semiconductor material of example 7 at room temperature were confirmed. As a result, gate modulation could be confirmed and it could be confirmed that the organic semiconductor thin film has played a role of the channel forming region. $2.0 \times 10^{-9}$ $cm^2$ $V^{-1}$ $second^{-1}$ was obtained as mobility in the saturated region at that time depending on conditions of the spin coating and the like.

While the present invention has been described according to the embodiments above, it should be appreciated that the present invention is not limited to those preferred embodiments. That is, structures, arrangements, manufacturing conditions and manufacturing methods of the organic field-effect transistors according to the present invention have been described and shown by way of example and it is needless to say that these can be changed freely. When the organic field-effect transistor (FET) according to the present invention is applied to and used by a display apparatus and various kinds of electronic device, it can be formed as a monolithic integrated circuit in which many FETs are integrated in the substrate and the supporting member or each FET may be cut to provide individual parts, which can be used as discrete assemblies.

A polyacene compound is a compound in which benzene rings are bonded in a straight fashion and a polyacene compound without substituent has properties in which it becomes more difficult to be dissolved into an organic solvent in accordance with the increase of the number of benzene rings. In particular, a polyacene greater than a pentacene having five benzene rings bonded loses solubility relative to almost all of organic solvents and it is difficult to form a uniform film based on a suitable method such as a spin coating method. If possible, then it is unavoidable that the organic solvent available in this case is limited to extremely limited organic solvents and temperature conditions. However, according to the present application, since the organic semiconductor material consists of the polyacene derivatives into which the substituents were introduced, it is possible to improve solubility of the organic semiconductor material relative to various kinds of organic solvents. Hence, it is possible to form/deposit a uniform film based on the coating process such as the spin coating method. As earlier noted, since 2,3,9,10-tetramethyl pentacene and 2,3-dimethyl pentacene are known well, it has been reported that, if 1,2-dichlorobenzene with high extractability is in use, the organic semiconductor material is slightly dissolved in the state in which it is warmed. Therefore, it can be gathered from this report that introduction of substituents into the polyacene derivatives in the organic semiconductor material considerably affects solubility of the organic semiconductor materials into the organic solvents.

Also, according to the present application, not only the solubility of the organic semiconductor material with respect to the organic solvent can be improved but also oxidation resistance can be improved and control of packing rules (herringbone structure/stack structure), in the organic semiconductor thin film and crystallinity can be improved by the introduction of substituents. Further, by using the polyacene derivative in which a substituent with a polarity and a substituent without polarity are introduced into desired positions, it becomes possible to control orientation and inclination of the organic semiconductor material relative to a base material (underlying layer or substrate). Also, it becomes possible to carry out patterning on the organic semiconductor material by bonding the polyacene derivative to functional groups introduced into desired positions of a base material (underlying layer or substrate). Further, the polyacene derivatives have a possibility that they will change their conductivity types depending on the substituents. It is known that, while ordinary pentacene without substituent behaves as a p-type semiconductor, pentacene in which all hydrogen atoms are replaced with fluorine atoms acts as an n-type semiconductor. Then, according to the present invention, since the organic semiconductor material is formed as the polyacene derivative into which the substituents are introduced, electron transition energy is changed with the result that it becomes possible to control a conductivity type.

It should be understood by those skilled in the art that various modifications, combinations, sub-combinations and alterations may occur depending on design requirements and other factors insofar as they are within the scope of the appended claims or the equivalents thereof.

The invention is claimed as follows:

1. An organic semiconductor material consisting of a polyacene derivative expressed by the following general formula (I):

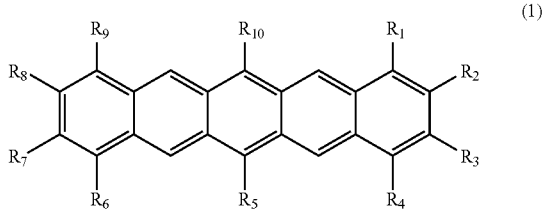

(1)

wherein each of $R_1$, $R_2$, $R_3$, $R_4$, $R_5$, $R_6$, $R_7$, $R_8$, $R_9$ and $R_{10}$ may be independently the same substituents or different substituents but all of $R_1$, $R_4$, $R_5$, $R_6$ and $R_{10}$ may never be hydrogen atoms at the same time; and wherein each of $R_1$, $R_2$, $R_3$, $R_4$, $R_5$, $R_6$, $R_7$, $R_8$, $R_9$ and $R_{10}$ is at least one kind of substituent selected from the group consisting of an aliphatic hydrocarbon group having a substituent and of which number of carbon atoms ranges from 1 to 20, an aromatic hydrocarbon group having a substituent, a complex aromatic group having a substituent, a carboxyl group, a hydride, an ester group, a cyano group, a hydroxyl group, a thiocarboxyl group, a dithiocarboxyl group, a sulfonic acid group, a sulfinic acid group, a sulfenic acid group, a sulfonyl group, a sulfinyl group, an acyl halide group, a carbamoyl group, a hydrazide group, an imide group, an amide group, an amidino group, an isocyano group, a cyanic acid ester group, an isocyanic acid ester group, a thiocyanic acid ester group, an isothiocyanic acid ester group, a formyl group, a thioformyl group, an acyl group, a thiol group, an amino group, an imino group, a hydrazino group, an alkoxy group, an arlyoxy group, an ether group, a sulfide group, a disulfide group, a silyl group, a germyl group, a stannyl group, a phosphino group, a boryl group, a halogen atom and a hydrogen atom, and wherein for at least one of $R_1$, $R_2$, $R_3$, $R_4$, $R_5$, $R_6$, $R_7$, $R_8$, $R_9$ and $R_{10}$, the carbon of the substituent directly bonded to the benzene ring having the acene bone does not have a double or triple bond, and wherein a substituent at a part of acene bone is an alkyl group having greater than 3 carbon atoms.

2. An organic semiconductor material according to claim 1, wherein each of $R_1$, $R_2$, $R_3$, $R_4$, $R_5$, $R_6$, $R_7$, $R_8$, $R_9$ and $R_{10}$ is at least one kind of substituent selected from the group consisting of: an aliphatic hydrocarbon group having a substituent and of which number of carbon atoms ranges from 1 to 20, an aromatic hydrocarbon group having a substituent, a complex aromatic group, a carboxyl group, a hydride, an ester group, a cyano group, a hydroxyl group, a halogen atom and a hydrogen atom.

3. An organic semiconductor thin film made of an organic semiconductor material according to claim 2, said organic semiconductor thin film having crystallinity.

4. An organic semiconductor thin film according to claim 3, having a stack structure.

5. An organic semiconductor device including an organic semiconductor thin film made of the organic semiconductor material according to claim 2, said organic semiconductor thin film having crystallinity.

6. An organic semiconductor device according to claim 5, wherein the organic semiconductor thin film has a stack structure.

7. An organic semiconductor device according to claim 6, wherein said organic semiconductor device comprises a source/drain electrode, a channel forming region sandwiched between a source/drain electrode and a source/drain electrode, a gate insulating layer and a gate electrode opposed to said channel forming region through said gate insulating layer, said channel forming region being composed of the organic semiconductor thin film.

8. An organic semiconductor device according to claim 5, wherein said organic semiconductor device comprises a source/drain electrode, a channel forming region sandwiched between a source/drain electrode and a source/drain electrode, a gate insulating layer and a gate electrode opposed to said channel forming region through said gate insulating layer, said channel forming region being composed of the organic semiconductor thin film.

9. An organic semiconductor thin film made of an organic semiconductor material according to claim 1, said organic semiconductor thin film having crystallinity.

10. An organic semiconductor thin film according to claim 9, having a stack structure.

11. An organic semiconductor device including an organic semiconductor thin film made of the organic semiconductor material according to claim 1, said organic semiconductor thin film having crystallinity.

12. An organic semiconductor device according to claim 11, wherein the organic semiconductor thin film has a stack structure.

13. An organic semiconductor device according to claim 12, wherein said organic semiconductor device comprises a source/drain electrode, a channel forming region sandwiched between a source/drain electrode and a source/drain electrode, a gate insulating layer and a gate electrode opposed to said channel forming region through said gate insulating layer, said channel forming region being composed of the organic semiconductor thin film.

14. An organic semiconductor device according to claim 11, wherein said organic semiconductor device comprises a source/drain electrode, a channel forming region sandwiched between a source/drain electrode and a source/drain electrode, a gate insulating layer and a gate electrode opposed to said channel forming region through said gate insulating layer, said channel forming region being composed of the organic semiconductor thin film.

* * * * *